US012812948B2

(12) United States Patent
Lin et al.

(10) Patent No.: US 12,812,948 B2
(45) Date of Patent: Nov. 24, 2026

(54) SPACER STRUCTURES AND CONTACT STRUCTURES IN SEMICONDUCTOR DEVICES

(71) Applicant: Taiwan Semiconductor Manufacturing Company, Ltd., Hsinchu (TW)

(72) Inventors: Zhi-Chang Lin, Hsinchu County (TW); Jung-Hung Chang, Changhua County (TW); Shih-Cheng Chen, New Taipei City (TW); Chih-Hao Wang, Hsinchu County (TW); Chien Ning Yao, Hsinchu (TW); Tsung-Han Chuang, Tainan City (TW); Kuo-Cheng Chiang, Hsinchu County (TW)

(73) Assignee: Taiwan Semiconductor Manufacturing Company, Ltd.

( * ) Notice: Subject to any disclaimer, the term of this patent is extended or adjusted under 35 U.S.C. 154(b) by 830 days.

(21) Appl. No.: 18/181,678

(22) Filed: Mar. 10, 2023

(65) Prior Publication Data

US 2023/0369456 A1 Nov. 16, 2023

Related U.S. Application Data

(60) Provisional application No. 63/404,899, filed on Sep. 8, 2022, provisional application No. 63/342,464, filed on May 16, 2022.

(51) Int. Cl.

*H01L 29/66* (2006.01)
*H10D 30/01* (2025.01)
(Continued)

(52) U.S. Cl.

CPC ......... *H10D 64/021* (2025.01); *H10D 30/014* (2025.01); *H10D 30/43* (2025.01);
(Continued)

(58) Field of Classification Search

CPC .... H10D 64/021; H10D 30/014; H10D 30/43; H10D 30/6729; H10D 30/6735;
(Continued)

(56) References Cited

U.S. PATENT DOCUMENTS 9,093,530 B2 7/2015 Huang et al.
9,171,929 B2 10/2015 Lee et al.
(Continued)

*Primary Examiner* — Cuong B Nguyen
(74) *Attorney, Agent, or Firm* — Sterne, Kessler, Goldstein & Fox P.L.L.C.

(57) ABSTRACT

A semiconductor device with back-side contact structures and a method of fabricating the same are disclosed. The semiconductor device includes first and second S/D regions, a stack of nanostructured semiconductor layers disposed adjacent to the first S/D region, a gate structure surrounding each of the nanostructured semiconductor layers, a first pair of spacers disposed on opposite sidewalls of the first S/D region, a second pair of spacers disposed on opposite sidewalls of the second S/D region, a third pair of spacers disposed on opposite sidewalls of the gate structure, a first contact structure disposed on a first surface of the first S/D region, and a second contact structure disposed on a second surface of the first S/D region. The first and second surfaces are opposite to each other. The first pair of spacers are disposed on opposite sidewalls of the second contact structure.

20 Claims, 21 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |

(52) U.S. Cl.

CPC ..... *H10D 30/6729* (2025.01); *H10D 30/6735* (2025.01); *H10D 30/6757* (2025.01); *H10D 62/121* (2025.01); *H10D 84/0128* (2025.01); *H10D 84/013* (2025.01); *H10D 84/0158* (2025.01); *H10D 84/038* (2025.01)

(58) Field of Classification Search

CPC ............. H10D 30/6757; H10D 62/121; H10D 84/0128; H10D 84/013; H10D 84/0158; H10D 84/038; H10D 30/0198; H10D 30/797; H10D 64/017; H10D 62/83; H10D 64/0112; H10D 62/151; H10D 62/822; H10D 64/62; H10D 64/251; H10D 84/0149; H10D 84/0151; H10D 84/83; H10W 20/0245; H10W 20/427; H10W 20/023; H10W 20/0242; B82Y 10/00

See application file for complete search history.

(56) References Cited

U.S. PATENT DOCUMENTS

| | | | | |
|---|---|---|---|---|
| 9,214,555 | B2 | 12/2015 | Oxland et al. | |
| 9,236,267 | B2 | 1/2016 | De et al. | |
| 9,520,482 | B1 | 12/2016 | Chang et al. | |
| 9,548,303 | B2 | 1/2017 | Lee et al. | |
| 9,564,489 | B2 | 2/2017 | Yeo et al. | |
| 9,576,814 | B2 | 2/2017 | Wu et al. | |
| 9,601,342 | B2 | 3/2017 | Lee et al. | |
| 9,608,116 | B2 | 3/2017 | Ching et al. | |
| 11,121,236 | B2 | 9/2021 | Wu et al. | |
| 2020/0357930 | A1 | 11/2020 | Glass et al. | |
| 2022/0102554 | A1 | 3/2022 | Guttman et al. | |
| 2023/0087444 | A1 * | 3/2023 | Thomson ............. | H10D 64/017 257/351 |

* cited by examiner

SPACER STRUCTURES AND CONTACT STRUCTURES IN SEMICONDUCTOR DEVICES

CROSS-REFERENCE TO RELATED APPLICATIONS

This application claims the benefit of U.S. Provisional Patent Application No. 63/404,899, titled "Spacer Structures and Contact Structures in Semiconductor Devices," filed Sep. 8, 2022, and U.S. Provisional Patent Application No. 63/342,464, titled "Semiconductor Device Structure," filed May 16, 2022, each of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), fin field effect transistors (finFETs), and gate-all-around (GAA) FETs. Such scaling down has increased the complexity of semiconductor manufacturing processes.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
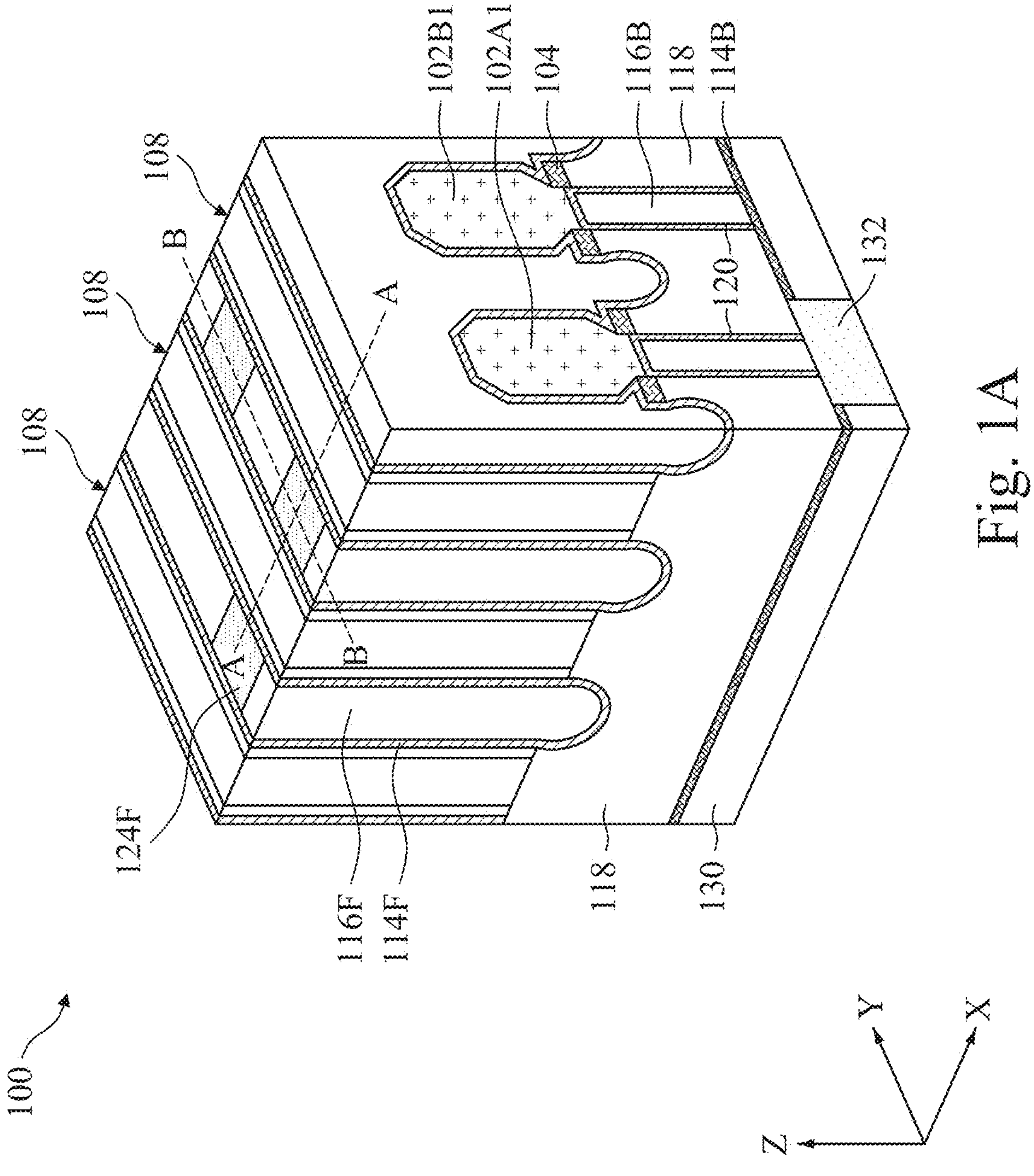
FIG. 1A illustrates an isometric view of a semiconductor device with a back-side power rail, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The increasing demand for small, portable multifunctional electronic devices has increased the demand for low power devices that can perform increasingly complex and sophisticated functions while providing ever-increasing storage capacity. As a result, there is a continuing trend in the semiconductor industry to manufacture low-cost, highperformance, and low-power semiconductor devices in integrated circuits (ICs). These goals have been achieved in large part by scaling down the dimensions of the semiconductor devices, thus increasing the device density of the ICs. However, continued scaling also introduces considerable device fabrication challenges. For example, the scaled down dimensions have increased the challenges of preventing epitaxial source/drain (S/D) regions on adjacent fin structures of FETs (e.g., finFETs or GAA FETs) from merging with each other during fabrication. In addition, forming electrical connections between the S/D regions and front-side power rail structures in scaled down semiconductor devices have also become challenging.

The present disclosure provides example semiconductor devices (e.g., GAA FETs) having epitaxial S/D regions with reduced lateral dimensions and contact structures electrically connecting S/D regions with a back-side power rail. The present disclosure also provides example methods to manufacture the semiconductor devices.

In some embodiments, the semiconductor device can have S/D spacers formed along sidewalls of fin structures prior to epitaxially growing the S/D regions on the fin structures. The S/D spacers can include a dielectric material and can control the epitaxial lateral growth of the S/D regions. In some embodiments, the S/D spacers can limit the epitaxial lateral growth of each side of the S/D regions to a lateral dimension of about 1 nm to about 15 nm. To limit the epitaxial lateral growth to such lateral dimensions, the S/D spacers can have a width of about 3 nm to about 15 nm and a thickness of about 1 nm to about 30 nm. Thus, the S/D spacers can prevent the S/D regions on adjacent fin structures from merging during their epitaxial growth process. In addition, the use of S/D spacers reduces the number of processing steps and cost for forming the electrically isolated S/D regions on adjacent fin structures compared to other methods of forming electrically isolated S/D regions on adjacent fin structures without the S/D spacers.

In some embodiments, portions of the fin structures under the back-sides of one or more of the S/D regions can be replaced with back-side contact structures and the other portions of the fin structures under the other S/D regions and gate structures of the semiconductor device can be replaced with a first back-side dielectric layer. The back-side contact structures can be electrically connected to a back-side power rail formed in a second back-side dielectric layer disposed on the first back-side dielectric layer. In some embodiments, the formation of the back-side power rail and the electrical connections of one or more of the S/D regions to the back-side power rail can reduce device area and the number and dimension of interconnects between S/D regions and power rails, thus reducing device power consumption compared to other semiconductor devices without back-side power rails. In addition, the back-side power rail can be formed with a lower resistance than a front-side power rail formed on the front-sides of the S/D regions, as the back-side power rail can be formed in a larger area than the front-side power rail.

Furthermore, the back-side contact structures can be formed with smaller widths (e.g., about 5 nm to about 10 nm smaller than widths of the S/D regions) than front-side contact structures, which require deeper etching of the S/D regions than the back-side contact structures. Thus, electrically connecting the S/D regions to the back-side power rail through the back-side contact structures can reduce the loss of S/D regions during back-side contact structure formation, thus improving device performance compared to that of devices with S/D regions electrically connected to front-side power rails through front-side contact structures.

Figure 1C:
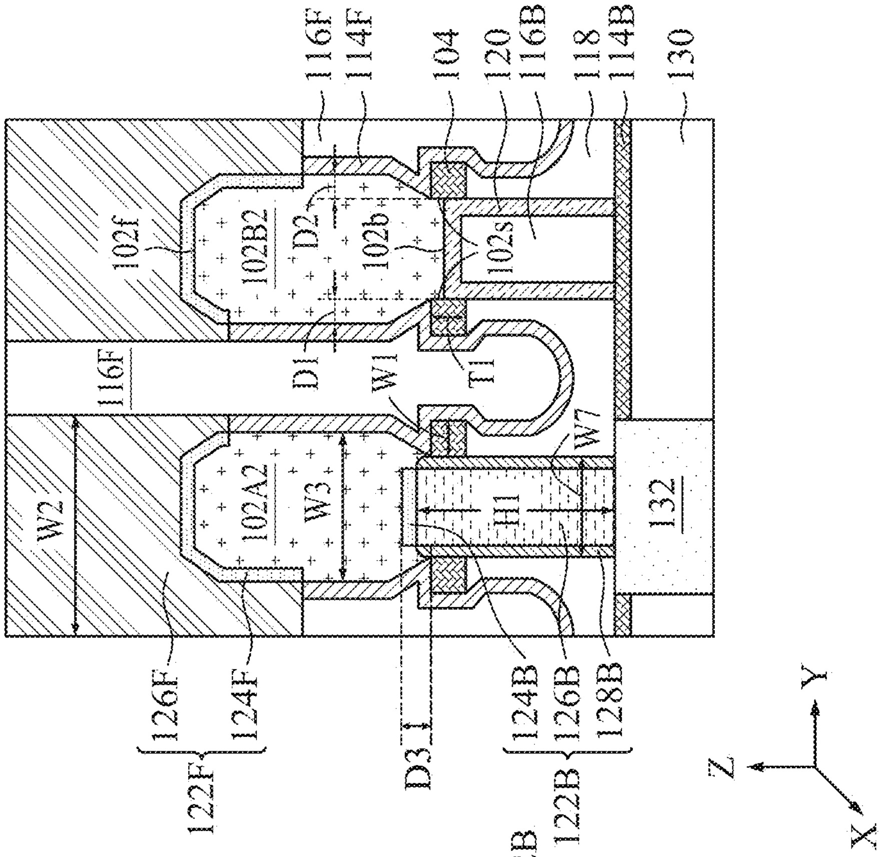
FIG. 1B-1E illustrate different cross-sectional views of a semiconductor device with a back-side contact structure and a back-side power rail, in accordance with some embodiments.
Figure 1B:
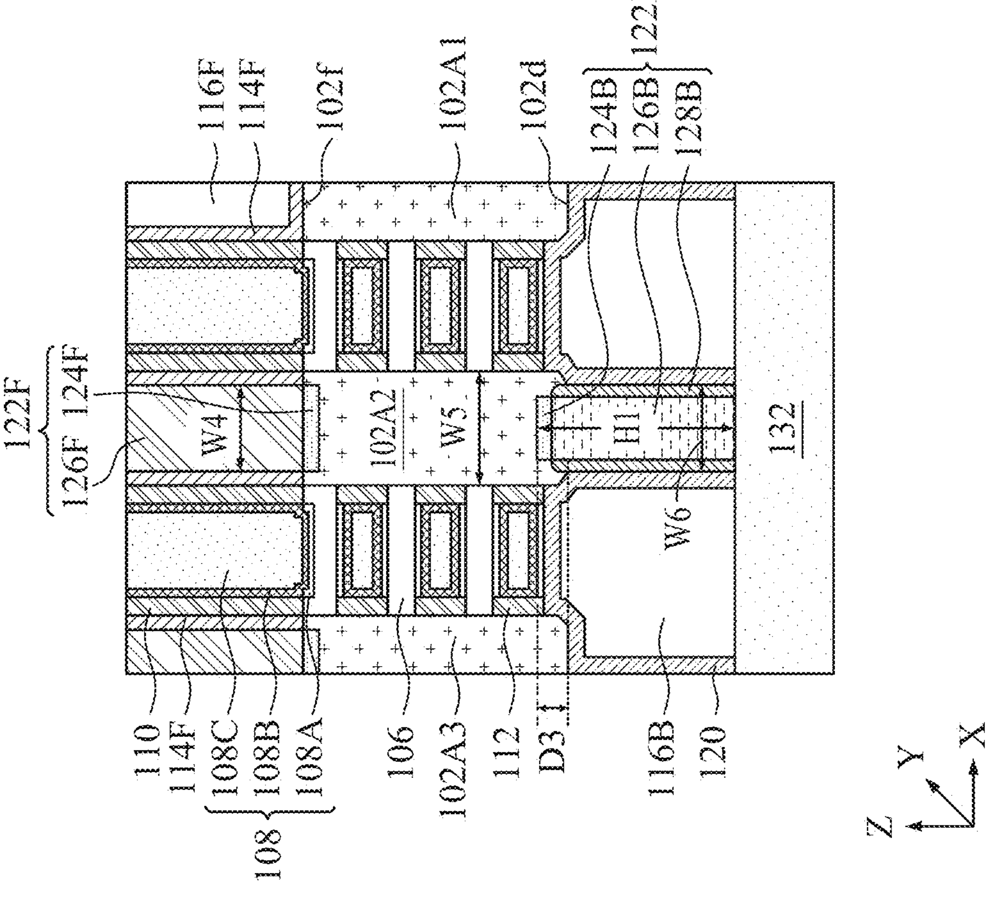
Figure 1E:
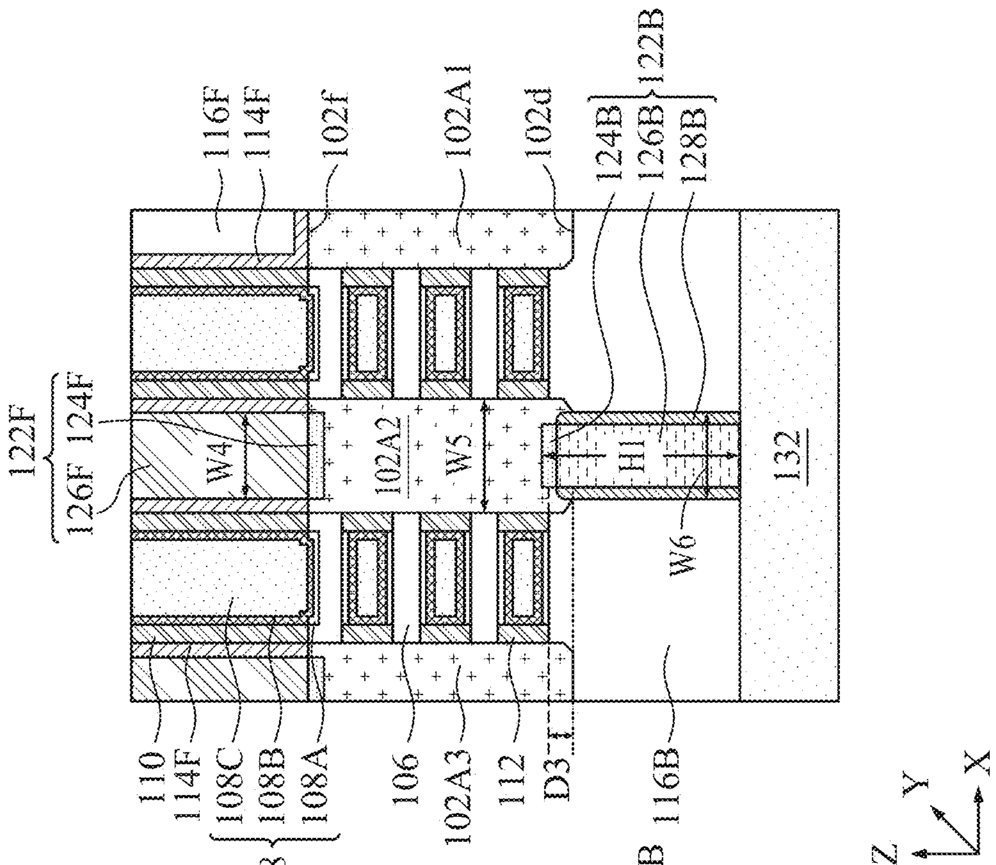
Figure 1D:
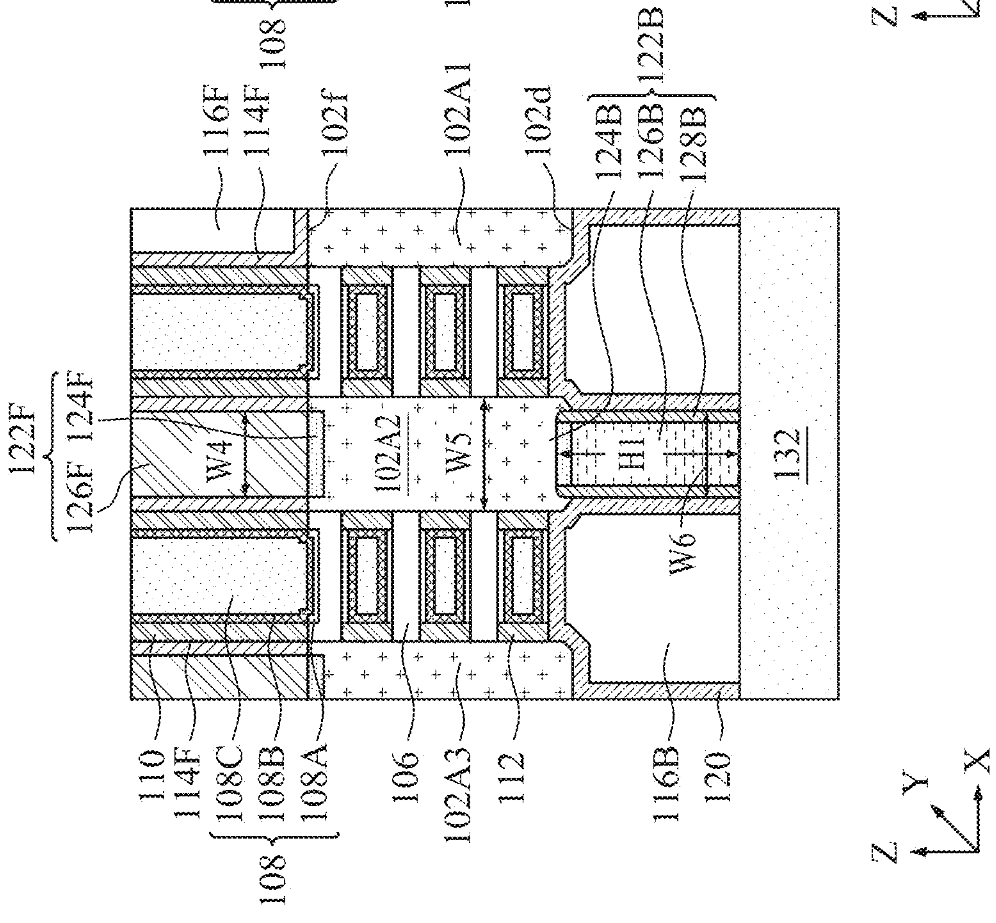
Figure 1F:
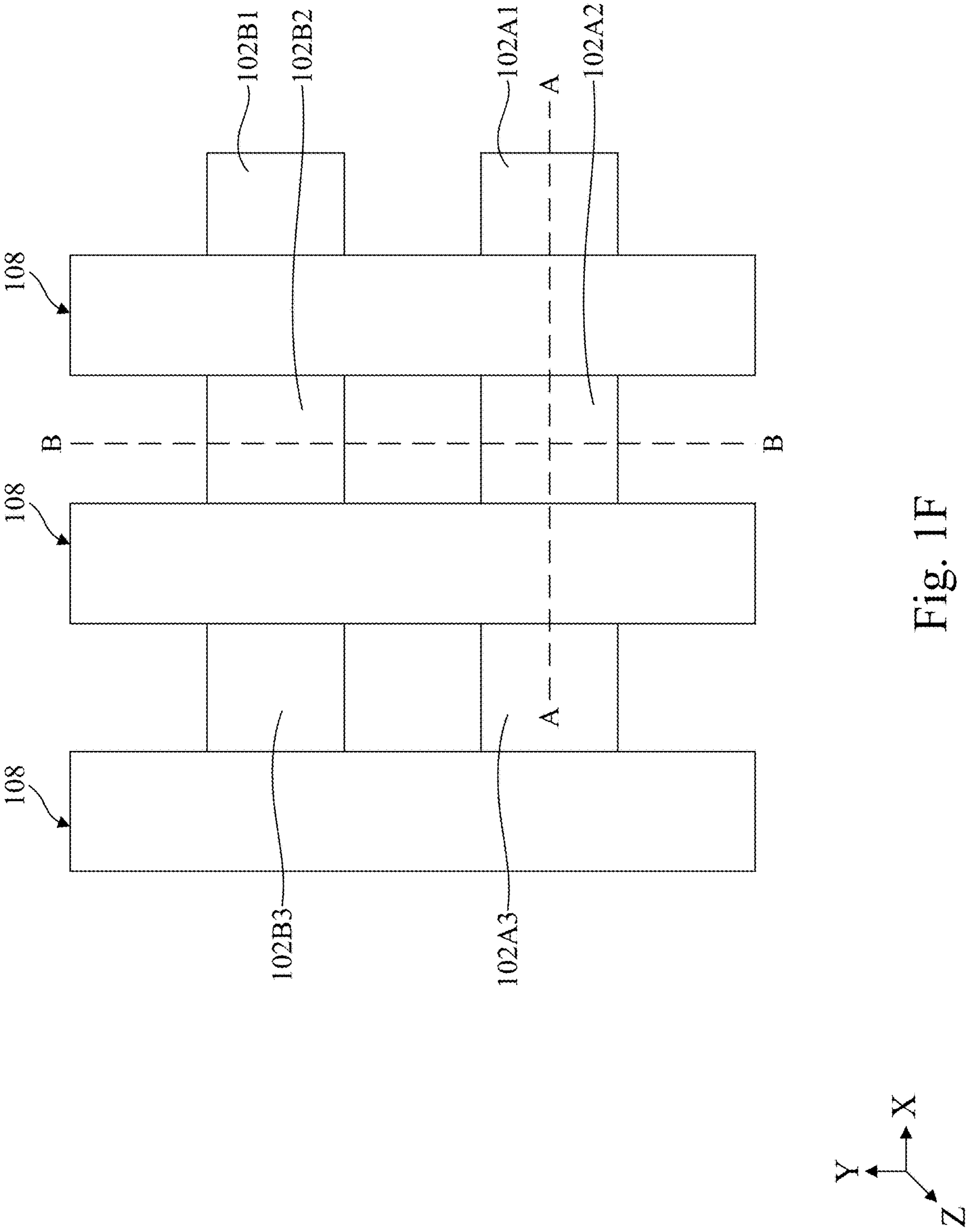
FIG. 1F illustrates a top-down view of a semiconductor device with a back-side contact structure and a back-side power rail, in accordance with some embodiments.

FIG. 1A illustrates an isometric view of a FET 100 (also referred to as a "GAA FET 100"), according to some embodiments. FIG. 1B illustrates a cross-sectional view of FET 100, along lines A-A of FIGS. 1A and 1F, according to some embodiments. FIG. 1C illustrates a cross-sectional view of FET 100, along lines B-B of FIGS. 1A and 1F, according to some embodiments. FIGS. 1D and 1E illustrate different cross-sectional views of FET 100, along lines A-A of FIGS. 1A and 1F, according to some embodiments. FIG. 1F illustrates a top-down view of FET 100, according to some embodiments. FIGS. 1B, 1C, 1D, and 1E illustrate cross-sectional views of FET 100 with additional structures that are not shown in FIG. 1A for simplicity. FIG. 1F does not show some of the elements of FIG. 1A and 1B-1D for simplicity. The discussion of elements with the same annotations applies to each other, unless mentioned otherwise. In some embodiments, FET 100 can represent n-type FET 100 (NFET 100) or p-type FET 100 (PFET 100) and the discussion of FET 100 applies to both NFET 100 and PFET 100, unless mentioned otherwise.

Referring to FIGS. 1A, 1B, 1C, and 1F, FET 100 can include (i) S/D regions 102A1-102A3 and 102B1-102B3, (ii) S/D spacers 104, (iii) stacks of nanostructured channel regions 106 disposed adjacent to S/D regions 102A1-102A3 and 102B1-102B3, (iv) gate structures 108 disposed surrounding nanostructured channel regions 106, (v) outer gate spacers 110, (vi) inner gate spacers 112, (vii) front-side (FS) etch stop layer (ESLs) 114F, (viii) back-side (BS) ESLs 114B, (ix) FS interlayer dielectric (ILD) layers 116F, (x) BS ILD layers 116B, (xi) shallow trench isolation (STI) regions 118, (xii) BS barrier layers 120, (xiii) FS contact structures 122F, (xiv) BS contact structure 122B, (xv) BS dielectric layer 130, and (xvi) BS power rail 132. In the description below, S/D regions 102A1-102A3 and 102B1-102B3 are collectively referred to as "S/D regions 102" and the discussion of S/D regions 102 applies to each of S/D regions 102A1-102A3 and 102B1-102B3, unless mentioned otherwise. In some embodiments, S/D regions 102 can refer to a source region or a drain region. The FS elements of FET 100 are disposed on FS surface 102_f_ of S/D regions 102 and the BS elements of FET 100 are disposed on BS surface 102_b_ of S/D regions 102.

In some embodiments, for NFET 100, each of S/D regions 102 can include an epitaxially-grown semiconductor material, such as Si and silicon carbide (SiC) doped with n-type dopants, such as phosphorus and other suitable n-type dopants. In some embodiments, for PFET 100, each of S/D regions 102 can include an epitaxially-grown semiconductor material, such as Si and SiGe doped with p-type dopants, such as boron and other suitable p-type dopants.

In some embodiments, the epitaxial lateral growth of S/D regions 102 along a Y-axis can be controlled by S/D spacers 104. As a result, S/D spacers 104 can prevent adjacent S/D regions 102, such as S/D regions 102A1 and 102B1, 102A2 and 102B2, and 102A3 and 102B3 from merging with each other during the epitaxial growth of S/D regions 102. In some embodiments, S/D spacers 104 can limit the epitaxial lateral growth of each S/D region 102 to lateral distances D1 and D2 extending outwards from bottom sidewalls 102_s_ of S/D region 102, as shown in FIG. 1C. In some embodiments, S/D spacers 104 can limit the epitaxial lateral growth of each S/D region 102 such that lateral distances D1 and D2 are less than width W1 of S/D spacers 104. In some embodiments, lateral distances D1 and D2 can be about 1 nm to about 15 nm to prevent the merging of adjacent S/D regions 102 formed on adjacent fin structures 336A and 336B spaced apart from each other by about 10 nm to about 40 nm. Fin structures 336A and 336B are described below with reference to FIGS. 3A and 3B and are not shown in FIGS. 1A-1C as they are removed during subsequent processing on BS surface 102*b* of S/D regions 102.

The epitaxial lateral growth control of S/D regions 102 can depend on the dimension of S/D spacers 104. For example, to limit the epitaxial lateral growth of each S/D region 102 to lateral distances D1 and D2, S/D spacers 104 can have a width W1 of about 2 nm to about 15 nm and a thickness T1 of about 1 nm to about 30 nm. In some embodiments, S/D spacers 104 can include a dielectric material, such as silicon nitride (SiN), silicon oxynitride (SiON), silicon oxycarbide (SiCO), silicon carbon nitride (SiCN), silicon carbon oxynitride (SiCON), and other suitable dielectric materials. In some embodiments, in addition to epitaxial lateral growth of S/D regions 102, S/D spacers 104 can reduce or minimize the etching of STI regions 118 during the formation of S/D regions 102, as described below with reference to FIGS. 5A and 5B.

In some embodiments, FS contact structures 122F can be disposed directly on FS surfaces 102*f* of one or more S/D regions 102 (e.g., S/D regions 102A2, 102A3, and 102B2) to electrically connect S/D regions 102 to other elements of FET 100 and/or to other active and/or passive devices (not shown) in an integrated circuit. In some embodiments, each of FS contact structures 122F can include (i) a silicide layer 124F disposed directly on FS surface 102*f*, and (ii) a contact plug 126F disposed directly on silicide layer 124F. In some embodiments, silicide layers 124F can extend on sidewalls of S/D regions 102 to increase contact area with S/D regions, thus increasing conductivity between S/D regions 102 and FS contact structures 122F. In some embodiments, contact plugs 126F can have widths W2 along a Y-axis greater than width W3 of S/D regions 102 along a Y-axis to prevent misalignment between FS contact structures 122F and S/D regions 102. As a result of the larger width W2, contact plugs 126F can be partly disposed directly on ESLs 114F and ILD layers 116F surrounding S/D regions 102A2 and 102B2, as shown in FIG. 1C. Widths W4 of contact plugs 126F along an X-axis can be smaller than widths W5 of S/D regions 102 along an X-axis and can be limited by the spacing between gate structures 108, as shown in FIG. 1B.

In some embodiments, silicide layer 124F can include titanium silicide ($Ti_xSi_y$), tantalum silicide ($Ta_xSi_y$), molybdenum ($Mo_xSi_y$), zirconium silicide ($Zr_xSi_y$), hafnium silicide ($Hf_xSi_y$), scandium silicide ($Sc_xSi_y$), yttrium silicide ($Y_xSi_y$), terbium silicide ($Tb_xSi_y$), lutetium silicide ($Lu_xSi_y$), erbium silicide ($Er_xSi_y$), ybtterbium silicide ($Yb_xSi_y$), europium silicide ($Eu_xSi_y$), thorium silicide ($Th_xSi_y$), other suitable metal silicide materials, or a combination thereof for GAA NFET 100. In some embodiments, silicide layer 124F can include nickel silicide ($Ni_xSi_y$), cobalt silicide ($Co_xSi_y$), manganese silicide ($Mn_xSi_y$), tungsten silicide ($W_xSi_y$), iron silicide ($Fe_xSi_y$), rhodium silicide ($Rh_xSi_y$), palladium silicide ($Pd_xSi_y$), ruthenium silicide ($Ru_xSi_y$), platinum silicide ($Pt_xSi_y$), iridium silicide ($Ir_xSi_y$), osmium silicide ($Os_xSi_y$), other suitable metal silicide materials, or a combination thereof for GAA PFET 100. In some embodiments, contact plugs 126F can include conductive materials, such as cobalt (Co), tungsten (W), ruthenium (Ru), iridium (Ir), nickel (Ni), osmium (Os), rhodium (Rh), aluminum (Al), molybdenum (Mo), copper (Cu), zirconium (Zr), stannum (Sn), silver (Ag), gold (Au), zinc (Zn), cadmium (Cd), and a combination thereof.

FS ILD layers 116F and FS ESLs 114F can provide electrical isolation between FS contact structures 122F and between FS contact structures 122F and gate structures 108. In some embodiments, FS ILD layers 116F and FS ESLs 114F can include a dielectric material, such as silicon oxide ($SiO_2$), silicon nitride (SiN), silicon oxynitride (SiON), silicon oxycarbide (SiCO), silicon carbon nitride (SiCN), silicon carbon oxynitride (SiCON), and other suitable dielectric materials. In some embodiments, FS ILD layers 116F can include an oxide material and FS ESLs 114F can include a nitride material different from FS ILD layers 116F. In some embodiments, the portions of FS ESLs 114F extending below S/D spacers 104 can have a semi-circular-shaped or open-circular-shaped profile, as shown in FIGS. 1A and 1C.

In some embodiments, BS contact structure 122B can be disposed in S/D region 102A2 (shown in FIG. 1B, 1C, and 1E) or disposed directly on BS surface 102*b* of S/D region 102A2 (shown in FIG. 1D). BS contact structure 122B can electrically connect S/D region 102A2 to a BS power rail 132 disposed in BS dielectric layer 130. BS power rail 132 can include metal lines (not shown) of ruthenium (Ru), copper (Cu), or other suitable metals for providing power supply to S/D region 102A2 through BS contact structure 122B. In addition to or instead of S/D region 102A2, any of the other S/D regions 102A1, 102A3, 102B1, 102B2, and 102B3 can be electrically connected to BS power rail 132 through BS contact structures similar to BS contact structure 122B. The placement of BS power rail 132 on BS surfaces of S/D regions 102 can reduce device area and the number and dimension of interconnects (e.g., BS contact structure 122B) between S/D region 102A2 and BS power rail 132, thus reducing power consumption compared to other FETs without BS power rails.

In some embodiments, BS contact structure 122B can be formed with smaller dimensions than that of FS contact structures electrically connecting S/D regions to FS power rails in FETs without BS power rails. In some embodiments, BS contact structure 122B can have a height H1 of about 5 nm to about 40 nm and a width W6 that is smaller than width W5 of S/D region 102A2 by about 5 nm to about 10 nm. Such dimensions of BS contact structure 122B can achieve adequate electrical conductivity between BS contact structure 122B and S/D region 102A2 without compromising the size and manufacturing cost of FET 100. In addition to smaller dimensions, BS contact structure 122B can also be formed with less amount of etching of S/D region 102A2 compared to that with FS contact structures in FETs without BS power rails. For example, the formation of BS contact structure 122B extending into S/D region 102A2, as shown in FIGS. 1B and 1C, can include an etching of S/D region 102A2 to a shallow depth D3 of about 3 nm to about 20 nm. In another example, BS contact structure 122B can be formed directly on BS surface 102*b* of S/D region 102A2 (shown in FIG. 1D) without any substantial etching of S/D region 102A2. The formation of BS contact structure 122B with minimal or no etching of S/D region 102A2 can reduce or minimize etching damage to S/D region 102A2, thus improving device performance.

In some embodiments, BS contact structure 122B can be disposed between S/D spacers 104 of S/D region 102A2 and a width W7 of BS contact structure 122B can be limited by the distance between S/D spacers 104 of S/D region 102A2, as shown in FIG. 1C. In some embodiments, BS contact structure 122B can include (i) a silicide layer 124B disposed in S/D regions 102A2 (shown in FIGS. 1B, 1C, and 1E) or disposed directly on BS surface 102*b* of S/D region 102A2

(shown in FIG. 1D), (ii) a contact plug 126B disposed directly on silicide layer 124B, and (iii) a diffusion barrier layer 128B disposed directly on sidewalls of contact plug 126B and surrounding contact plug 126B. The discussion of silicide layer 124F applies to silicide layer 124B, unless mentioned otherwise. In some embodiments, silicide layers 124F and 124B can have the same material or different material from each other. In some embodiments, contact plugs 126B can include conductive materials, such as W, Ru, Co, Cu, Ti, Ta, Mo, Ni, titanium nitirde (TiN), tantalum nitirde (TaN), and other suitable conductive materials.

Diffusion barrier layer 128B can prevent the oxidation of contact plug 126B by preventing the diffusion of oxygen atoms from adjacent structures (e.g., BS ILD layers 116B and BS barrier layers 120) to contact plug 126B. In some embodiments, diffusion barrier layer 128B can include a dielectric material, such as silicon oxide ($SiO_2$), silicon nitride (SiN), silicon oxynitride (SiON), silicon carbon nitride (SiCN), silicon carbon oxynitride (SiOCN), aluminum oxide ($Al_2O_3$), aluminum oxynitride (AlON), zirconium oxide ($ZrO_2$), hafnium oxide ($HfO_2$), titanium oxide ($TiO_2$), zirconium aluminum oxide (ZrAlO), zinc oxide ($ZnO_2$), and other suitable dielectric materials. In some embodiments, diffusion barrier layers 128B can have a thickness of about 1.5 nm to about 4 nm. Within this range of thickness, diffusion barrier layer 128B can adequately prevent the oxidation of contact plugs 126B without compromising the size and manufacturing cost of FET 100.

In some embodiments, BS barrier layers 120 can be disposed directly on BS surfaces of gate structures 108 and on BS surfaces 102*b* of S/D regions 102 that do not have BS contact structures 122B, such as S/D regions 102A1, 102B1, and 102B2. BS ILD layers 116B can be disposed directly on BS barrier layers 120 and BS ESLs 114B can be disposed directly on BS ILD layers 116B. BS barrier layers 120, BS ILD layers 116B, and BS ESLs 114B can include a dielectric layer and can protect gate structures 108 and S/D regions 102 during the formation of BS elements, such as BS contact structure 122B and BS power rail 132. In addition, BS barrier layers 120 and BS ILD layers 116B can provide electrical isolation between BS contact structure 122B and other BS contact structures (not shown). In some embodiments, BS barrier layers 120 can include an oxide layer. The discussion of the materials of FS ILD layers 116F and FS ESL 114F applies to BS ILD layers 116B and BS ESL 114B, unless mentioned otherwise. In some embodiments, BS barrier layers 120 may not be included and BS ILD layers 116B can be disposed directly on BS surfaces of gate structures 108, as shown in FIG. 1E and on BS surface 102*b* of S/D regions 102 (not shown) that do not have BS contact structures 122B.

Referring to FIGS. 1A-1E, in some embodiments, nanostructured channel regions 106 can include semiconductor materials, such as Si, silicon arsenide (SiAs), silicon phosphide (SiP), SiC, SiCP, SiGe, Silicon Germanium Boron (SiGeB), Germanium Boron (GeB), Silicon-Germanium-Tin-Boron (SiGeSnB), a III-V semiconductor compound, or other suitable semiconductor materials. Though rectangular cross-sections of nanostructured channel regions 106 are shown, nanostructured channel regions 106 can have cross-sections of other geometric shapes (e.g., circular, elliptical, triangular, or polygonal). In some embodiments, nanostructured channel regions 106 can have be in the form of nanosheets, nanowires, nanorods, nanotubes, or other suitable nanostructured shapes. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm.

Referring to FIGS. 1A-1F, in some embodiments, gate structures 108 can be multi-layered structures and can at least partially surround each of nanostructured channel regions 106 for which gate structures 108 can be referred to as "GAA structures." FET 100 can be referred to as "GAA FET 100." In some embodiments, FET 100 can be a finFET and have fin regions (not shown) instead of nanostructured channel regions 106.

In some embodiments, each of gate structures 108 can include (i) an interfacial oxide (IL) layer 108A disposed on nanostructured channel regions 106, (ii) a high-k gate dielectric layer 108B disposed on IL layer 108A, and (iii) a conductive layer 108C disposed on high-k gate dielectric layer 108B. In some embodiments, IL layer 108A can include silicon oxide ($SiO_2$), silicon germanium oxide ($SiGeO_x$), or germanium oxide ($GeO_x$). In some embodiments, high-k gate dielectric layer 108B can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium aluminum oxide (ZrAlO), zirconium silicate ($ZrSiO_2$), lanthanum oxide ($La_2O_3$), aluminum oxide ($Al_2O_3$) zinc oxide (ZnO), hafnium zinc oxide (HfZnO), and yttrium oxide ($Y_2O_3$). In some embodiments, IL layer 108A can have a thickness of about 0.1 nm to about 2 nm and high-k gate dielectric layer 108B can have a thickness of about 0.5 nm to about 5 nm. Within these ranges of thicknesses, gate structures 108 can perform adequately without compromising the size and manufacturing cost of FET 100.

In some embodiments, conductive layer 108C can be a multi-layered structure. The different layers of conductive layer 108C are not shown for simplicity. Each of conductive layer 108C can include a work function metal (WFM) layer disposed on high-k gate dielectric layer 108B and a gate metal fill layer disposed on the WFM layer. In some embodiments, the WFM layer can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, or other suitable Al-based materials for GAA NFET 100. In some embodiments, the WFM layer can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, and tantalum copper (Ta—Cu) for GAA PFET 100. The gate metal fill layers can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

In some embodiments, gate structure 108 can be electrically isolated from adjacent FS contact structures 122F by outer gate spacers 110 and the portions of gate structures 108 surrounding nanostructured channel regions 106 can be electrically isolated from adjacent S/D regions 102 by inner gate spacers 112. Outer gate spacers 110 and inner gate spacers 112 can include a material similar to or different from each other. In some embodiments, outer gate spacers 110 and inner gate spacers 112 can include an insulating material, such as $SiO_2$, SiN, SiON, SiCO, SiCN, SiCON, and other suitable insulating materials. In some embodiments, each of outer gate spacers 110 can have a thickness of about 1 nm to about 10 nm. Within this range of thickness, adequate electrical isolation can be provided by outer gate spacers 110 between gate structures 108 and adjacent FS contact structures 122F without compromising the size and manufacturing cost of FET 100. In some embodiments, adjacent S/D spacers 104 and outer gate spacers 110 are portions of the same spacer material layer and can be in direct contact with each other, as described below with reference to FIGS. 3A-3B, 4A-4B, and 5A-5B.

Figure 2:
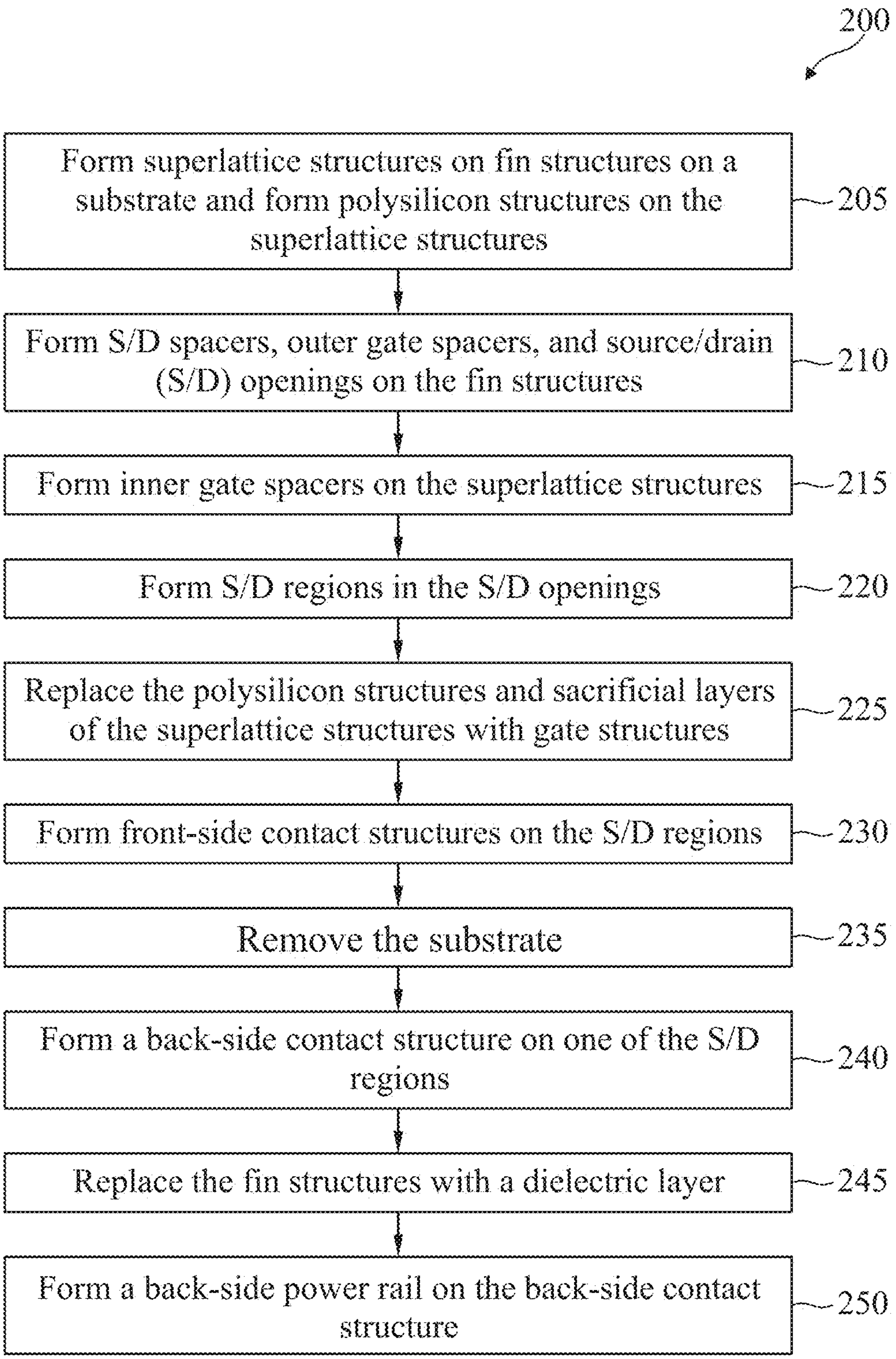
FIG. 2 is a flow diagram of a method for fabricating a semiconductor device with a back-side contact structure and a back-side power rail, in accordance with some embodiments.

FIG. 2 is a flow diagram of an example method 200 for fabricating FET 100 with cross-sectional views shown in FIGS. 1B and 1C, according to some embodiments. For illustrative purposes, the operations illustrated in FIG. 2 will be described with reference to the example fabrication process for fabricating stacked FET 100 as illustrated in FIGS. 3A-18A and 3B-18B. FIGS. 3A-18A are cross-sectional views of FET 100 along lines A-A of FIGS. 1A and 1F at various stages of its fabrication, according to some embodiments. FIGS. 3B-18B are cross-sectional views of FET 100 along lines B-B of FIGS. 1A and 1F at various stages of its fabrication, according to some embodiments. Operations can be performed in a different order or not performed depending on specific applications. It should be noted that method 200 may not produce a complete FET 100. Accordingly, it is understood that additional processes can be provided before, during, and after method 200, and that some other processes may only be briefly described herein. Elements in FIGS. 3A-18A and 3B-18B with the same annotations as elements in FIGS. 1A-1F are described above.

Figure 3A:
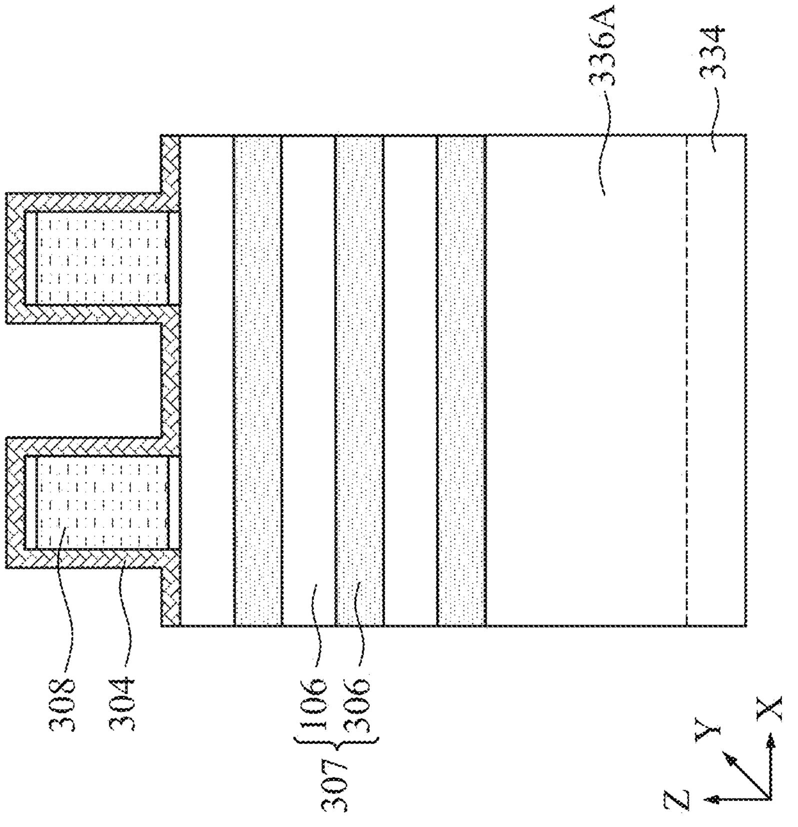
FIGS. 3A-18B illustrate cross-sectional views of a semiconductor device with a back-side contact structure and a back-side power rail at various stages of its fabrication process, in accordance with some embodiments.
Figure 3B:
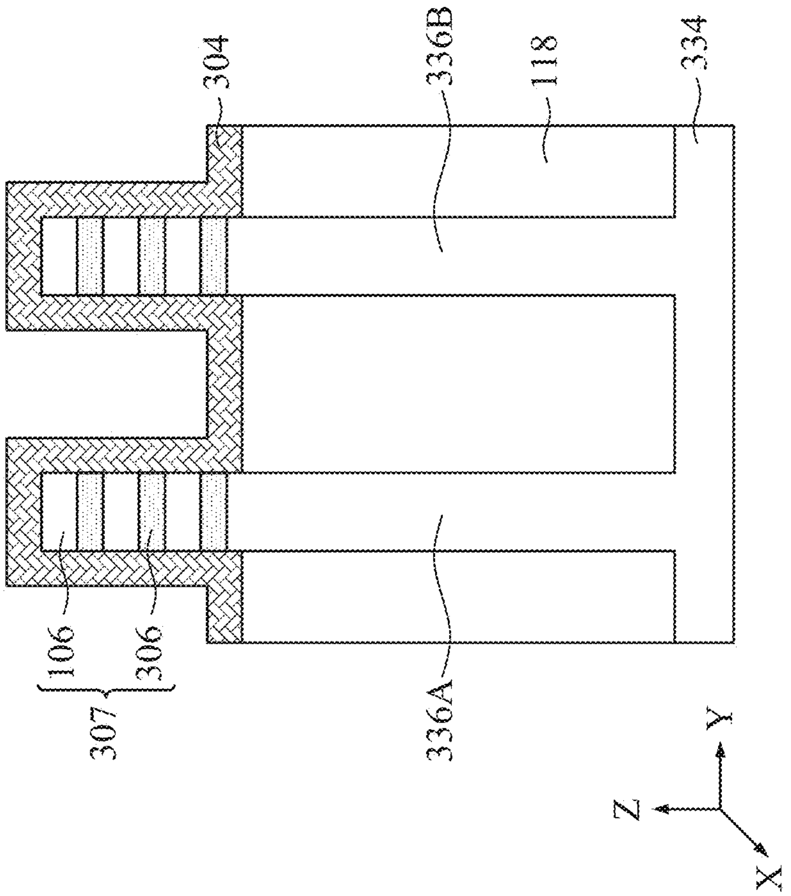

In operation 205, superlattice structures are formed on fin structures on a substrate, and polysilicon structures are formed on the superlattice structures. For example, as shown in FIGS. 3A and 3B, fin structures 336A and 336B are formed on a substrate 334, superlattice structures 307 are formed on fin structure 336A and 336B, and polysilicon structures 308 are formed on superlattice structures 307. Substrate 334 can include a semiconductor material, such as silicon, germanium (Ge), silicon germanium (SiGe), a silicon-on-insulator (SOI) structure, and a combination thereof. In some embodiments, fin structures 336A and 336B can include a material similar to substrate 334 and extend along an X-axis. Superlattice structures 307 can include nanostructured layers 106 and 306 arranged in an alternating configuration. In some embodiments, nanostructured layers 106 and 306 include materials different from each other. In some embodiments, nanostructured layers 106 can include Si and nanostructured layers 306 can include SiGe. Nanostructured layers 306 are also referred to as sacrificial layers 306. During subsequent processing, polysilicon structures 308 and sacrificial layers 306 can be replaced with gate structures 108 in a gate replacement process.

Referring to FIG. 2, in operation 210, S/D spacers, outer gate spacers, and S/D openings are formed on the fin structures. For example, as described with reference to FIGS. 3A-5A and 3B-5B, gate outer spacers 110 are formed on sidewalls of polysilicon structures 308, S/D spacers 104 are formed on sidewalls of fin structures 336A and 336B, and S/D openings 502 are formed on fin structures 336A and 336B.

Figure 4B:
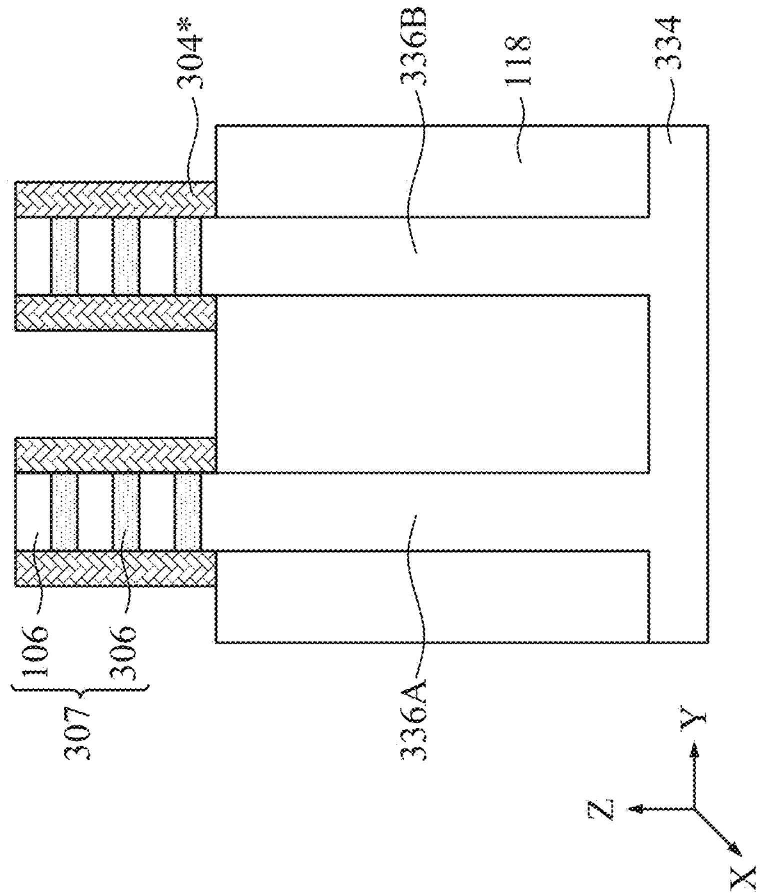
Figure 4A:
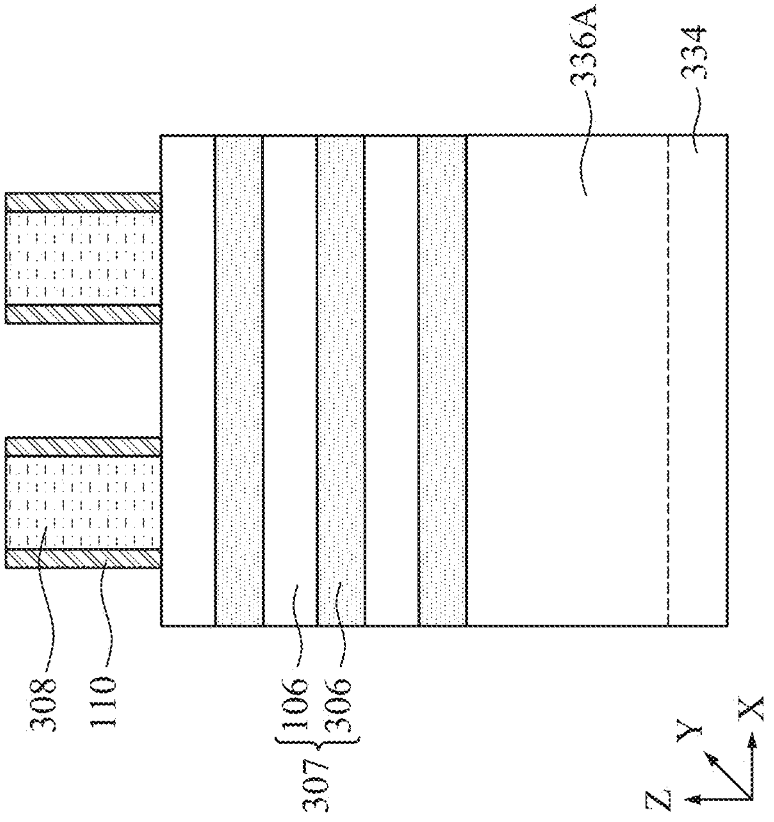

In some embodiments, outer gate spacers 110 and S/D spacers 104 can be formed from the same spacer material layer 304 at different stages of selectively dry etching spacer material layer 304. Spacer material layer 304 can include $SiO_2$, SiN, SiON, SiCO, SiCN, SiCON, and other suitable insulating materials. The formation of outer gate spacers 110 and S/D spacers 104 can start with depositing a substantially conformal spacer material layer 304 directly on polysilicon structures 308, superlattice structures 307, fin structures 336A and 336B above STI regions 118, and STI regions 118, as shown in FIGS. 3A and 3B. The deposition of spacer material layer 304 can be followed by a first etching process to etch portions of spacer material layer 304 from top surfaces of polysilicon structures 308, superlattice structures 307, and STI regions 118 to form the structures of FIGS. 4A and 4B. Thus, after the first etching process, outer gate spacers 110 can be formed as shown in FIG. 4A and spacer portions 304* on sidewall surfaces of superlattice structures 307 and fin structures 336A and 336B can be formed as shown in FIG. 4B. Outer gate spacers 110 are not visible in cross-sectional view of FET 100 in FIG. 4B.

In some embodiments, the first etching process can be an anisotropic dry etching process and can have a higher etching rate along a Z-axis rather than along an X-axis or a Y-axis. As a result, spacer material layer 304 on top surfaces of polysilicon structures 308, superlattice structures 307, and STI regions 118 can be removed, while spacer portions 304* on sidewall surfaces of superlattice structures 307 and fin structures 336A and 336B can remain. The etching gases used in the first etching process can have a higher selectivity for spacer material layer 304 than for polysilicon structures 308 and superlattice structures 307.

Figure 5B:
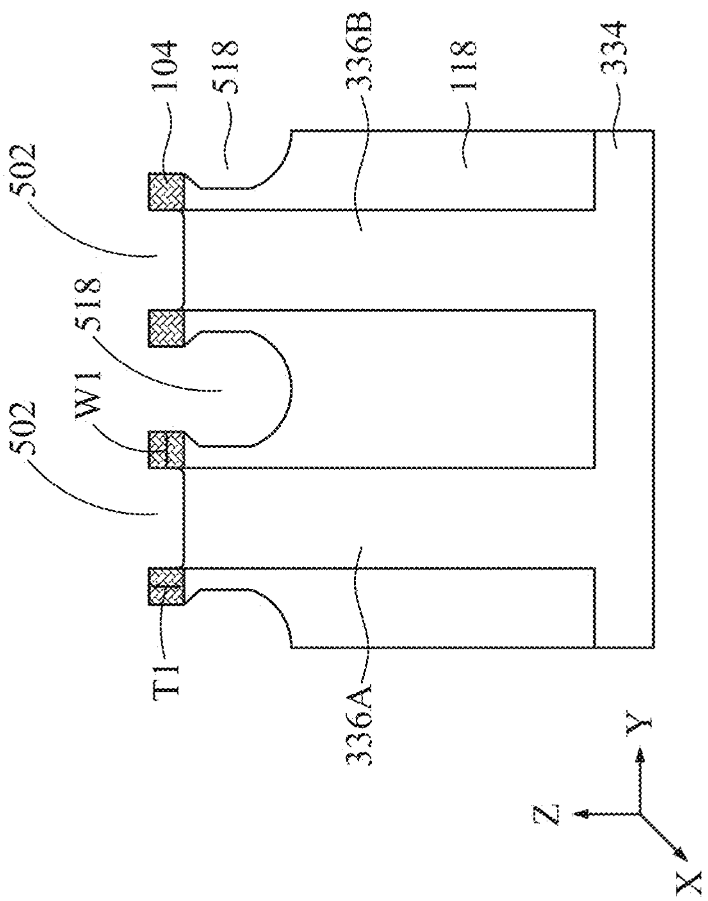
Figure 5A:
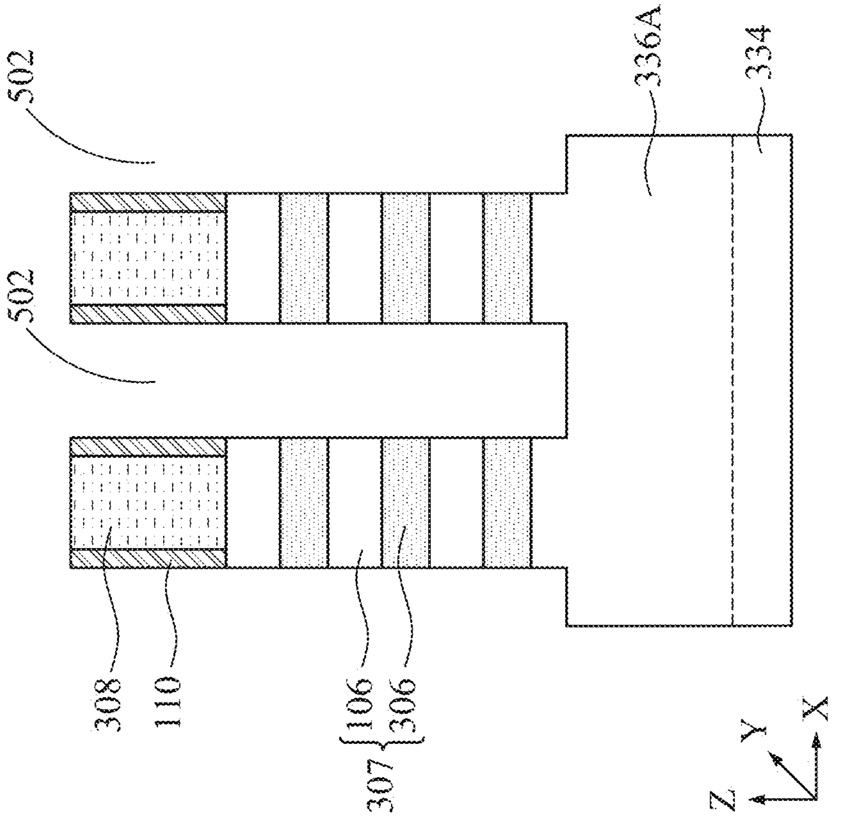

The first etching process can be followed by a second etching process to selectively etch portions of spacer portions 304* to form S/D spacers 104 and portions of superlattice structures 307 to form S/D openings 502, as shown in FIGS. 5A and 5B. S/D spacers 104 are not visible in cross-sectional view of FET 100 in FIG. 5A. In some embodiments, during the second etching process, the top surfaces of polysilicon structures 308 and the top surfaces of outer gate spacers 110 can be protected with a masking layer (not shown) formed after the first etching process.

In some embodiments, the second etching process can include a plasma-based dry etching process using etching gases, such as carbon tetrafluoride ($CF_4$), sulfur dioxide ($SO_2$), hexafluoroethane ($C_2F_6$), chlorine ($Cl_2$), nitrogen trifluoride ($NF_3$), sulfur hexafluoride ($SF_6$), and hydrogen bromide (HBr), with mixture gases, such as hydrogen ($H_2$), oxygen ($O_2$), nitrogen ($N_2$), and argon (Ar). The second etching process can be performed at a temperature ranging from about 25° C. to about 200° C. under a pressure from about 5 mTorr to about 50 mTorr. The flow rate of the etching gases can range from about 5 standard cubic centimeter per minute (sccm) to about 100 sccm. The plasma power can range from about 50 W to about 200 W with a bias voltage from about 30 V to about 200 V.

In some embodiments, width W1 and thickness T1 of S/D spacers 104 can be tuned by adjusting the second etching process conditions, such as the etch selectivity of the etching gases for superlattice structures 307 and spacer portions 304*, the flow rate of the etching gases, and the bias voltage of the plasma. In some embodiments, the etching gases used in the second etching process can have a higher selectivity for superlattice structures 307 than for spacer portions 304* to remove superlattice structures 307 at a higher etching rate than spacer portions 304*. As a result, at the end of the second etching process, the portions of superlattice structures 307 not covered by polysilicon structures 308 can be fully removed, while S/D spacers 104 can remain to control the epitaxial lateral growth of subsequently-formed S/D regions 102.

In some embodiments, the etching gases used in the second etching process can have a higher selectivity for STI regions 118 than for spacer portions 304*. As a result, portions of STI regions 118 can be etched to form recesses 518 in STI regions 118. In some embodiments, width W1 of S/D spacers 104 can be about 2 nm to about 15 nm to prevent recesses 518 from extending to fin structures 336A and 336B and exposing sidewalls of fin structures 336A and 336B to the etching gases of the second etching process.

Figure 6B:
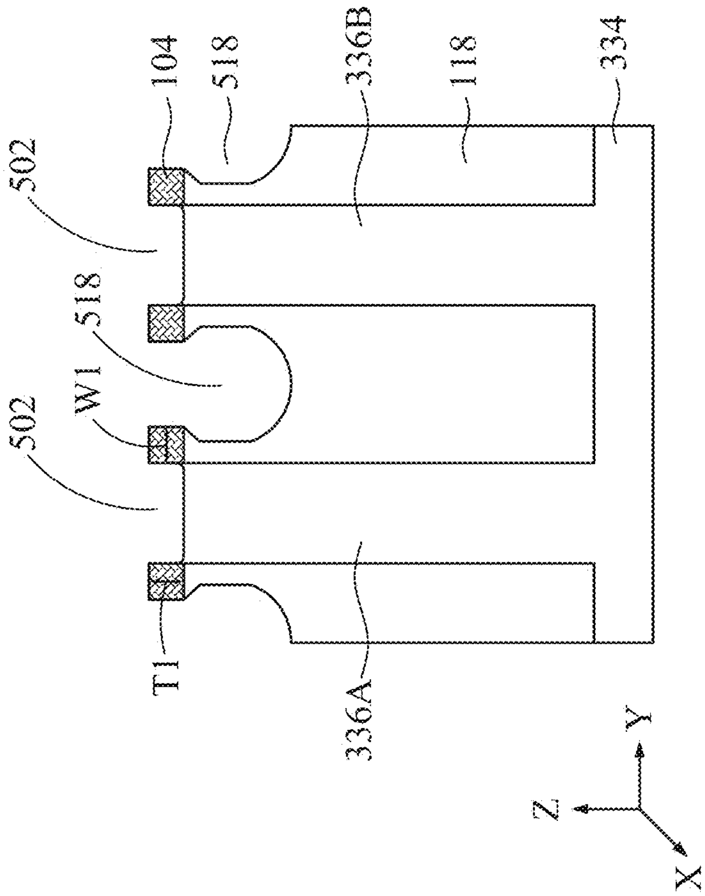
Figure 6A:
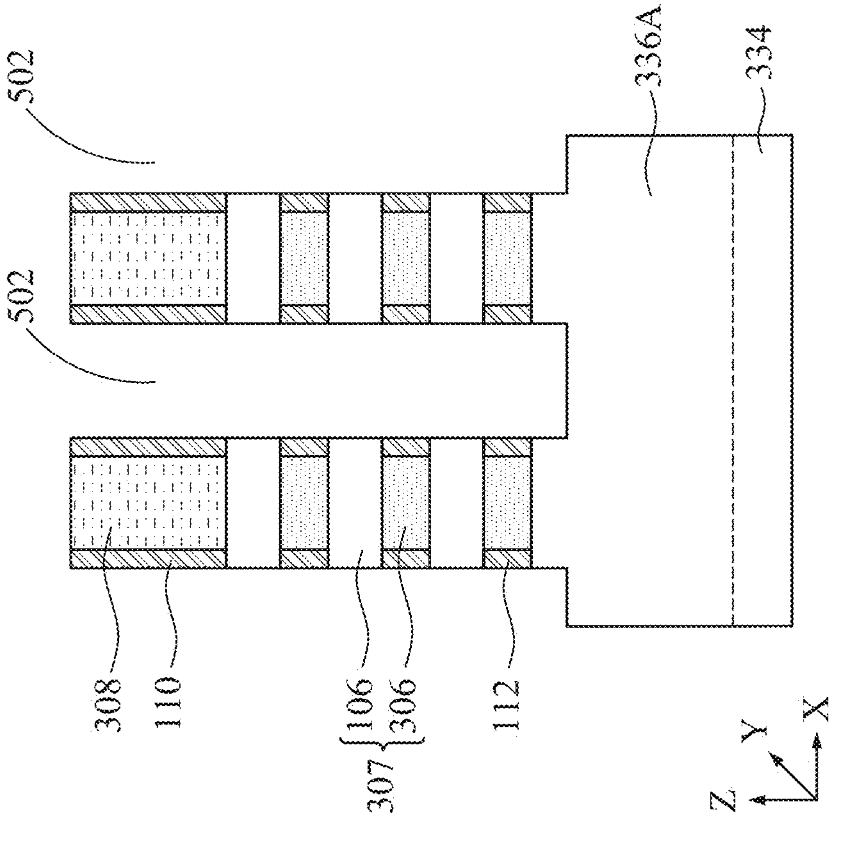

Referring to FIG. 2, in operation 215, inner gate spacers are formed on the superlattice structures. For example, as shown in FIG. 6A, inner gate spacers 112 can be formed on sidewall surfaces of sacrificial layers 306 of superlattice structures 307. Inner gate spacers 112 are not visible in cross-sectional view of FET 100 in FIG. 6B.

Figure 7B:
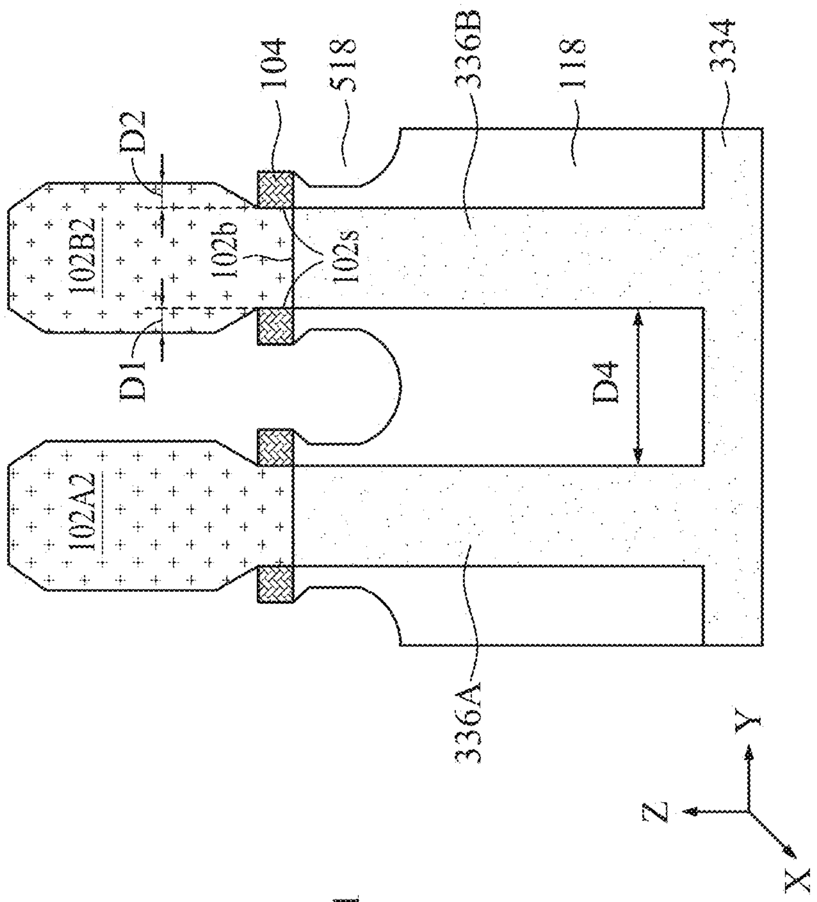
Figure 7A:
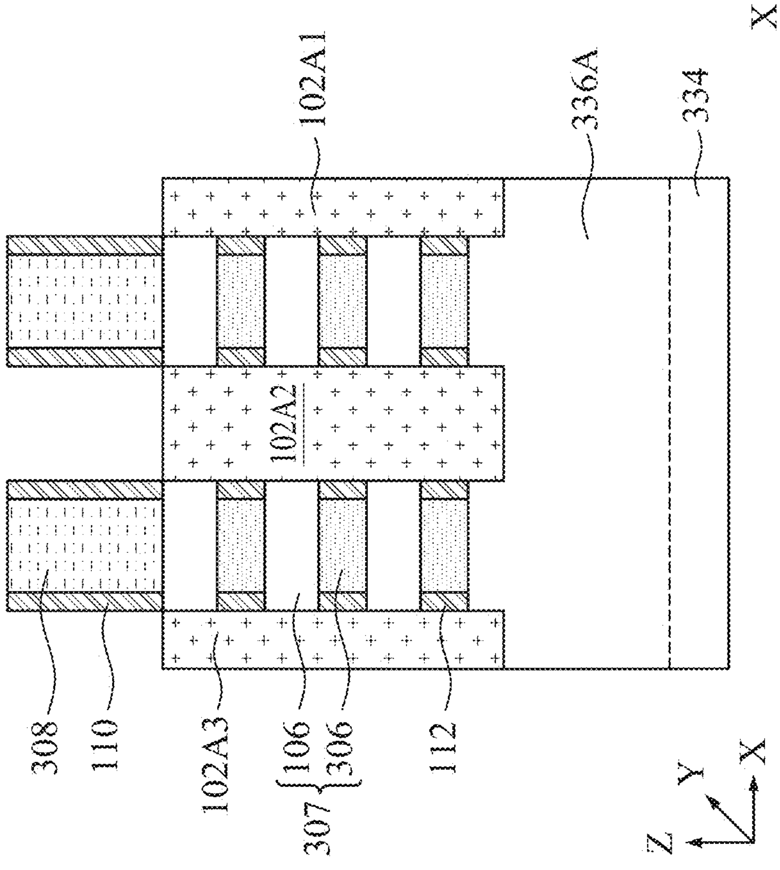

Referring to FIG. 2, in operation 220, S/D regions are formed in the S/D openings. For example, as shown in FIGS. 7A and 7B, S/D regions 102A1, 102A2, 102A3, and 102B2 are formed in S/D openings 502. S/D regions 102B1 and 102B3 are not visible in the cross-sectional views of FET 100 in FIGS. 7A and 7B. The formation of S/D regions 102 can include epitaxially growing the semiconductor material of S/D regions 102 on the exposed surfaces of nanostructured layers 106 facing S/D openings 502 and on exposed surfaces of fin structures 336A and 336B in S/D openings 502, as shown in FIGS. 6A and 6B. S/D spacers 104 can limit the epitaxial lateral growth of S/D regions 102 to lateral distances D1 and D2 extending outwards from bottom sidewalls 102*s* of S/D region 102, as shown in FIG. 7B. In some embodiments, lateral distances D1 and D2 can be about 1 nm to about 15 nm to prevent the merging of adjacent S/D regions 102A2 and 102B2 when formed on adjacent fin structures 336A and 336B spaced apart from each other by a distance D4 of about 10 nm to about 40 nm.

Figure 8A:
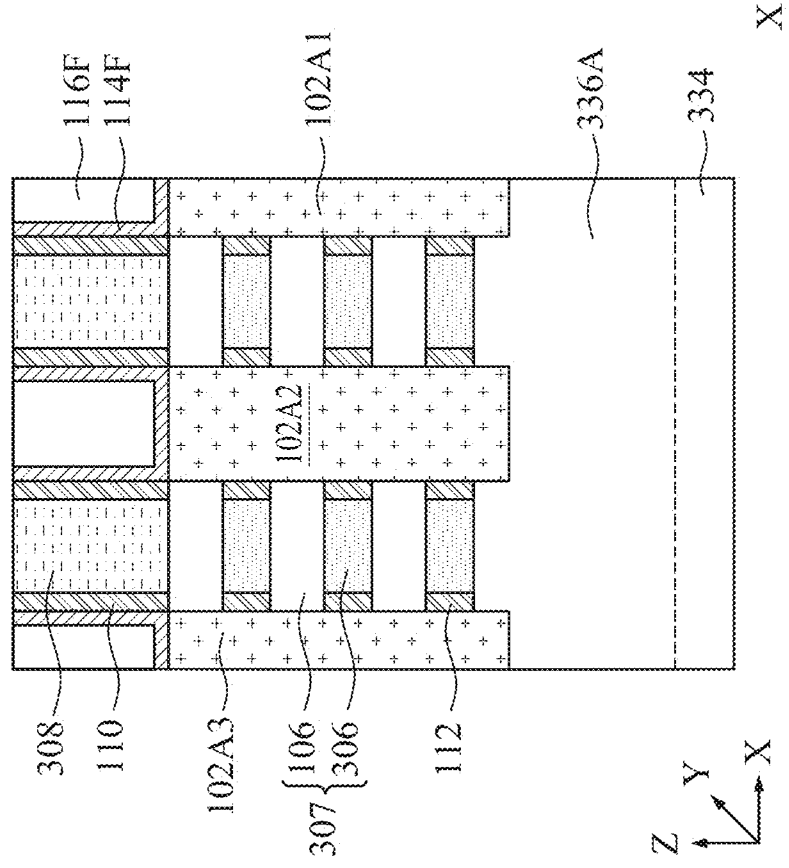
Figure 8B:
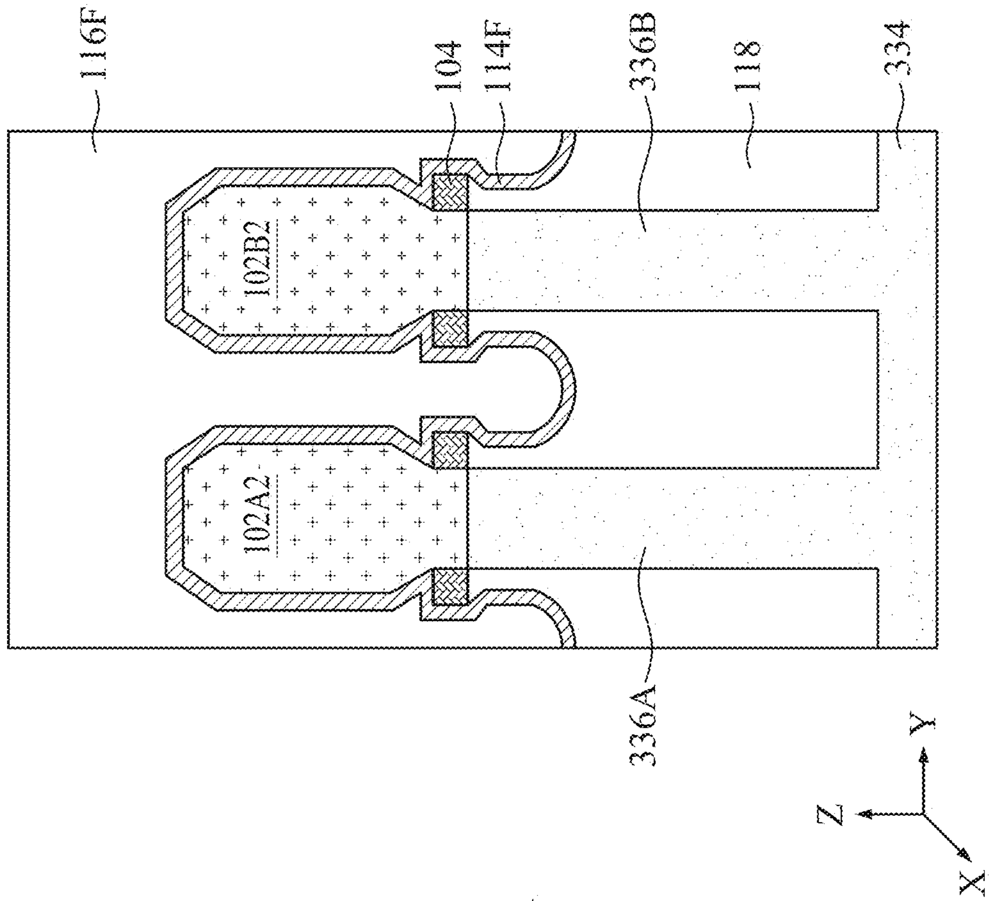

In some embodiments, the formation of S/D regions 102 can be followed by the deposition of FS ESLs 114F on the structures of FIGS. 7A and 7B to form the structures of FIGS. 8A and 8B. The deposition of FS ESLs 114F can be followed by the deposition of FS ILD layers 116F on FS ESLs 114F, as shown in FIGS. 8A and 8B.

Figure 9B:
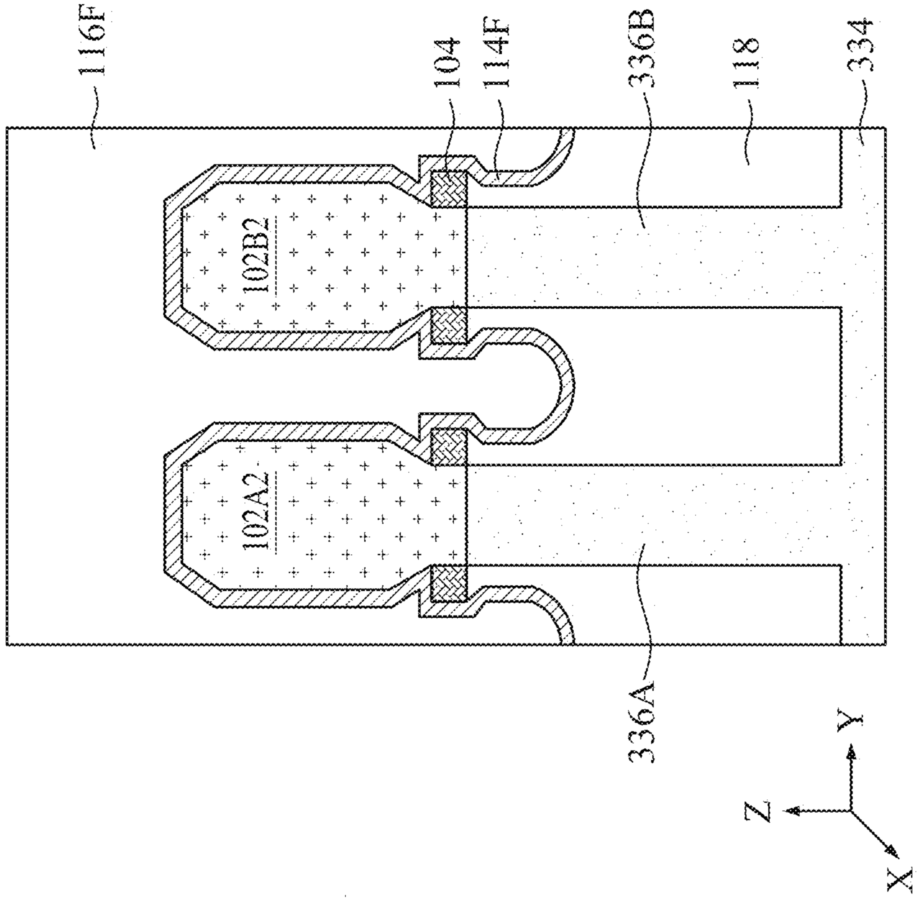
Figure 9A:
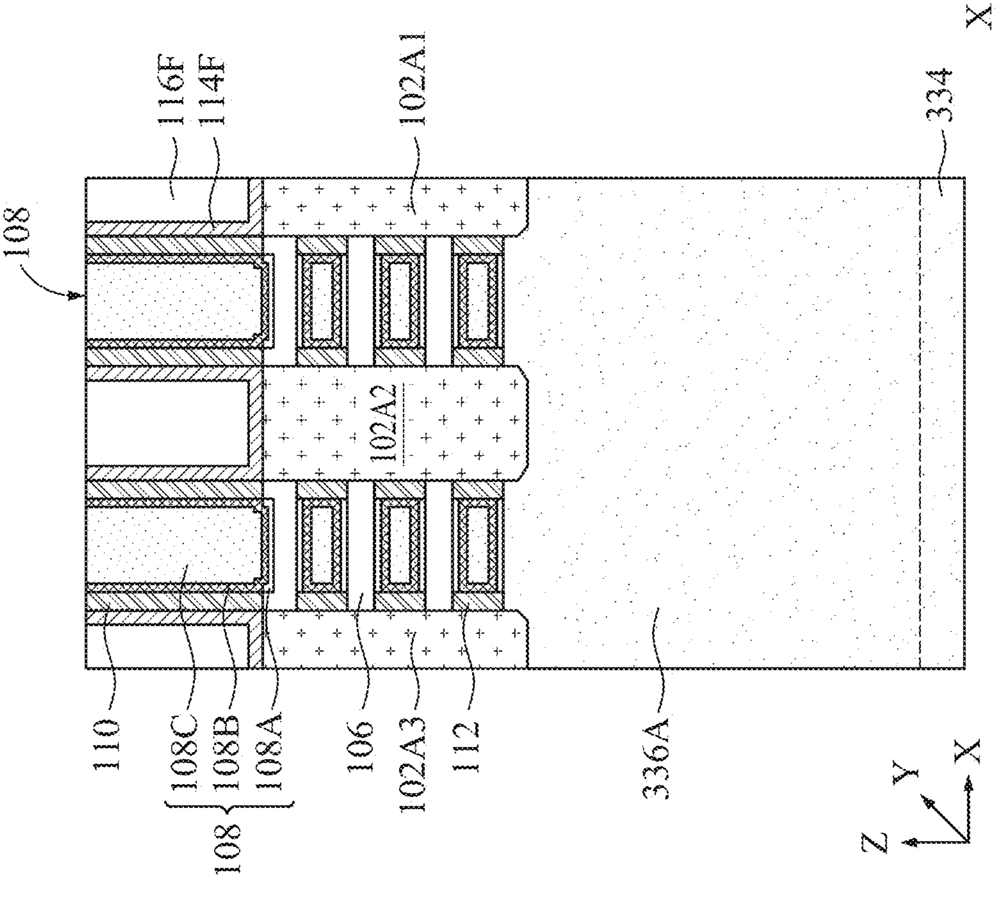

Referring to FIG. 2, in operation 225, the polysilicon structures and sacrificial layers are replaced with gate structures. For example, as shown in FIG. 9A, polysilicon structures 308 and sacrificial layers 306 are replaced with gate structures 108. Gate structures 108 are not visible in the cross-sectional view of FET 100 in FIG. 9B. The formation of gate structures 108 can include sequential operations of (i) removing polysilicon structures 308 and sacrificial layers 306 from the structures of FIGS. 8A-8B to form gate openings (not shown), (ii) forming IL oxide layers 108A within the gate openings, as shown in FIG. 9A, (iii) forming HK dielectric layers 108B on IL oxide layers 108A, as shown in FIG. 9A, and (iv) forming conductive layer 108C on HK dielectric layers 108B, as shown in FIG. 9A.

Figure 10A:
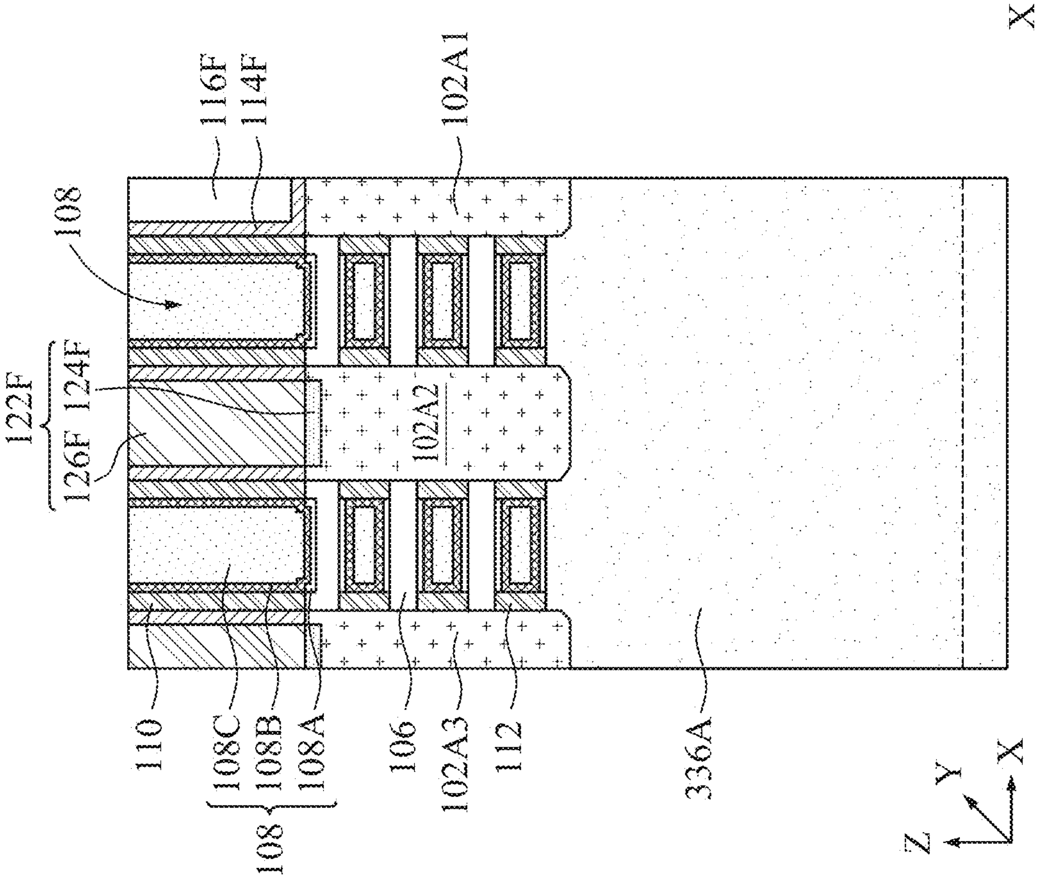
Figure 10B:
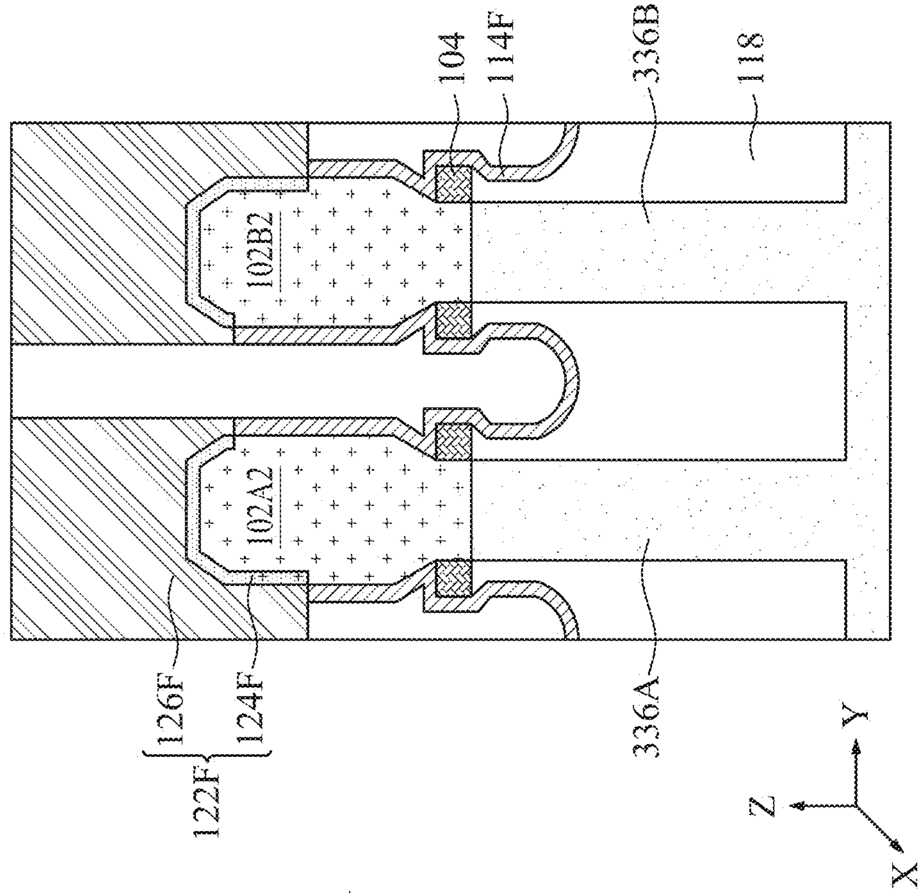

Referring to FIG. 2, in operation 230, FS contact structures are formed on the S/D region. For example, as shown in FIGS. 10A and 10B, FS contact structures 122F are formed on FS surfaces 102*f* of S/D regions 102A2, 102A3, and 102B2. The formation of FS contact structures 122F can include sequential operations of (i) forming contact openings (not shown) by etching FS ILD layers 116F and FS ESLs 114F from FS surfaces of S/D regions 102A2, 102A3, and 102B2, (ii) forming silicide layers 124F (shown in FIGS. 10A and 10B) on the exposed surfaces of S/D regions 102A2, 102A3, and 102B2 in the contact openings, (iii) depositing a conductive layer (not shown) on silicide layers 124F to fill the contact openings, and performing a chemical mechanical polishing (CMP) process to substantially coplanarize top surfaces of the conductive layer and FS ILD layers 116F to form the structures of FIGS. 10A and 10B.

Figure 11B:
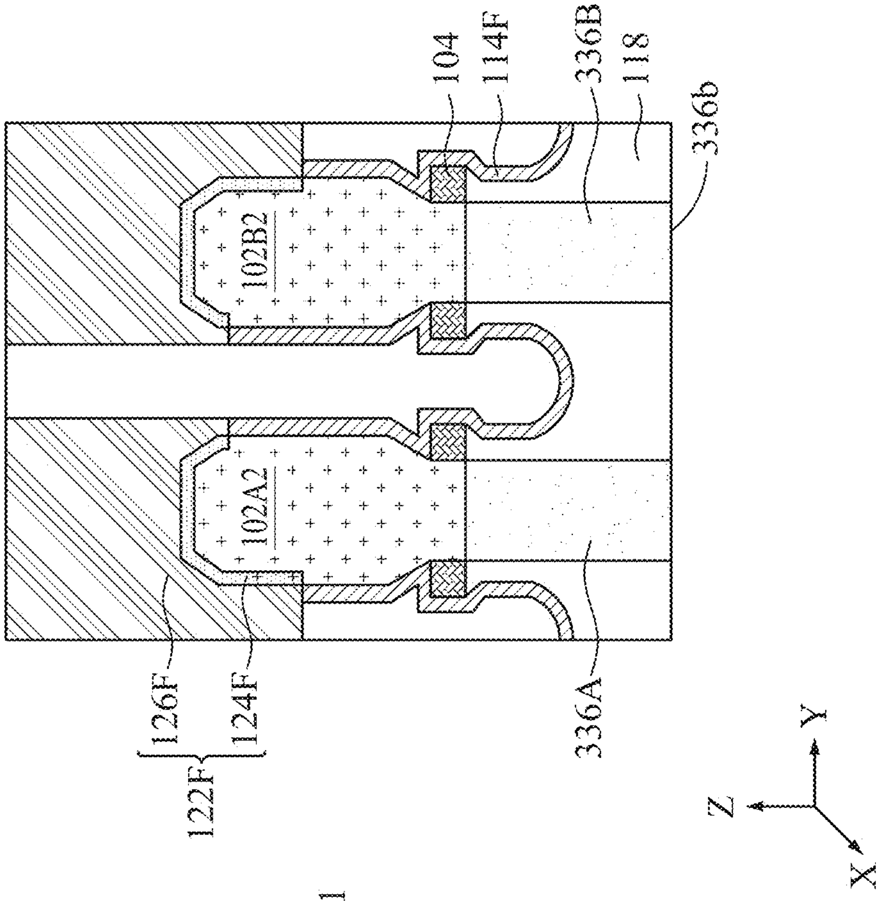
Figure 11A:
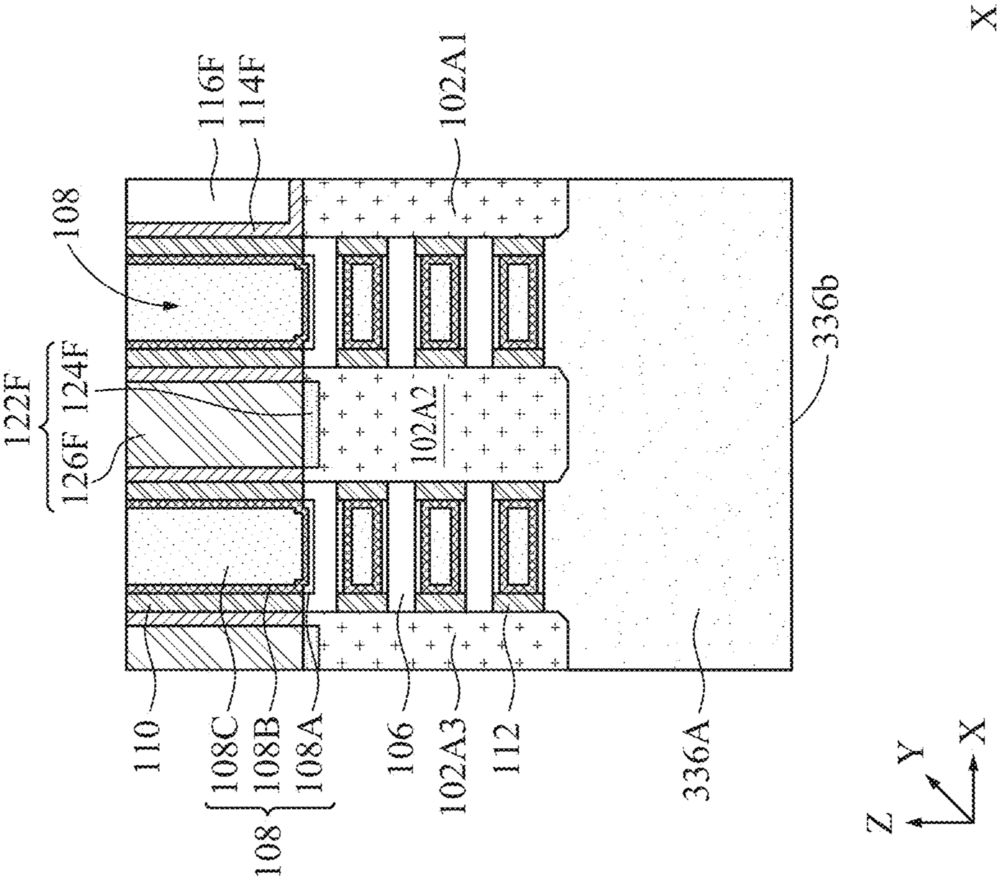

Referring to FIG. 2, in operation 235, the substrate is removed. For example, as shown in FIGS. 11A and 11B, substrate 334 is removed. The removal of substrate 334 can include bonding FET 100 to a carrier substrate (not shown) on the side of FS contact structures 122F and performing a CMP process on back-side surface of substrate 334 until BS surfaces 336*b* of fin structures 336A and 336B are exposed, as shown in FIGS. 11A and 11B.

Figure 12B:
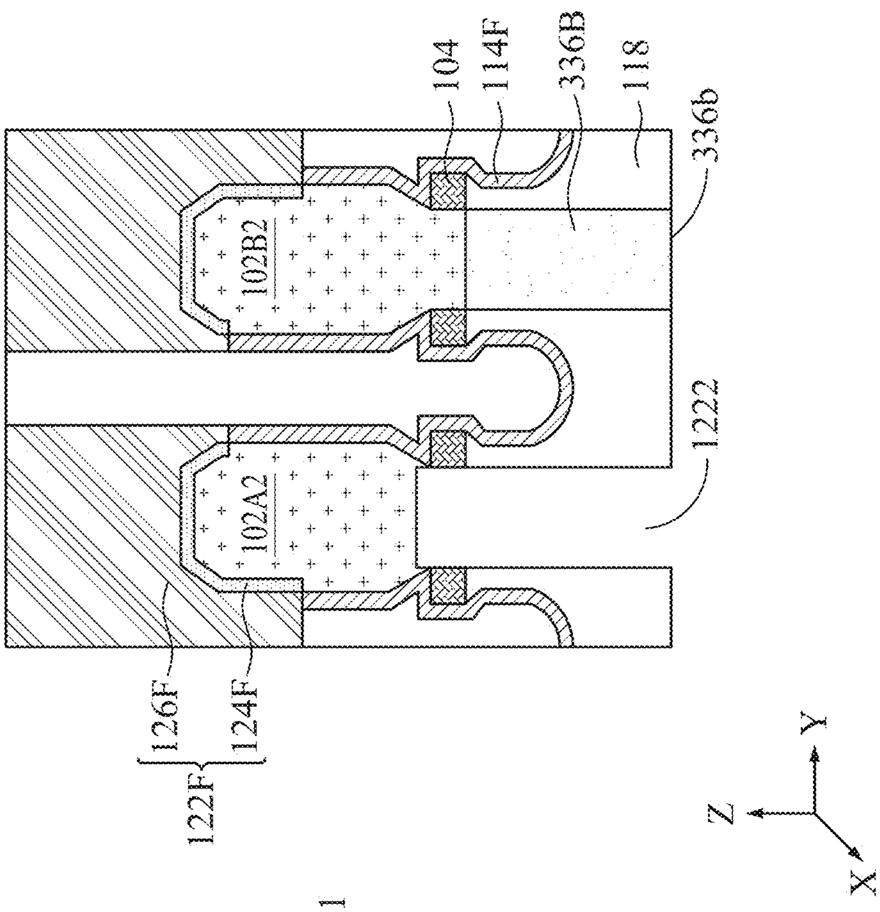
Figure 12A:
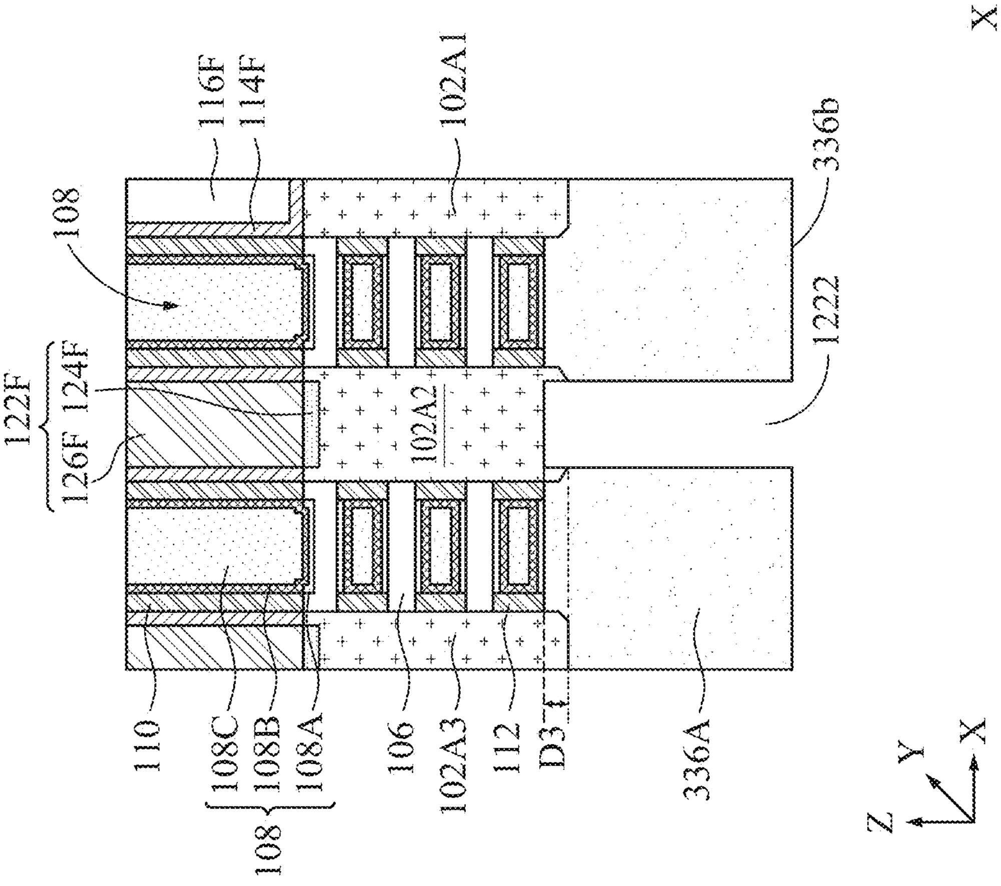
Figure 13B:
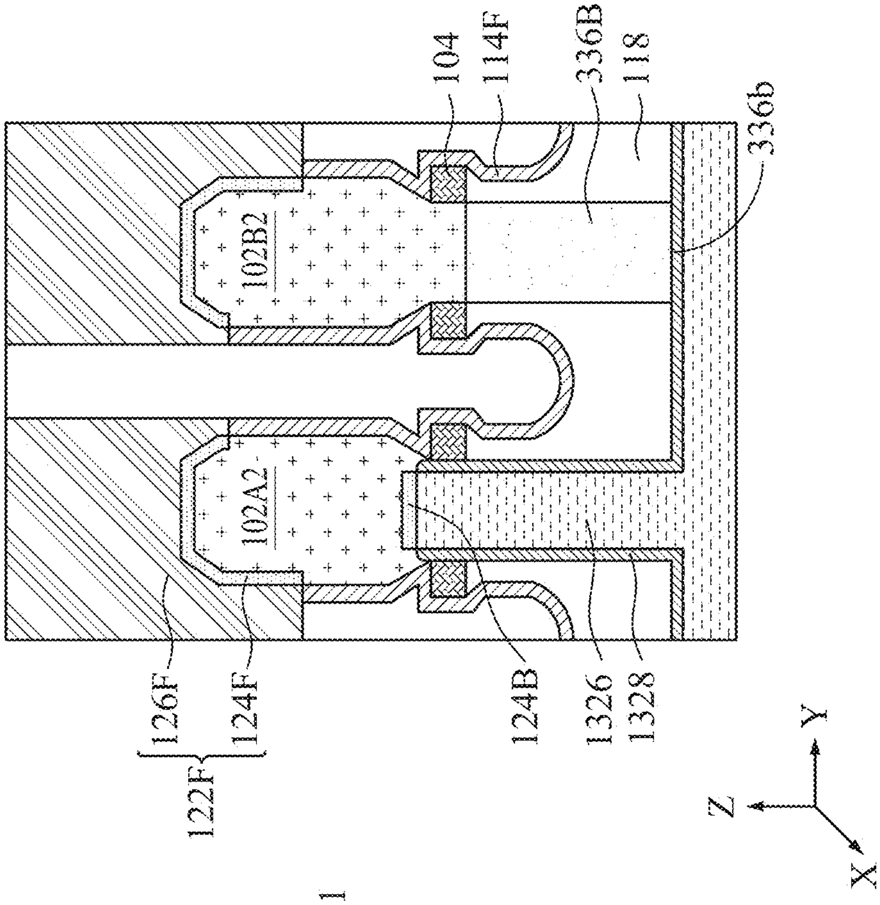
Figure 13A:
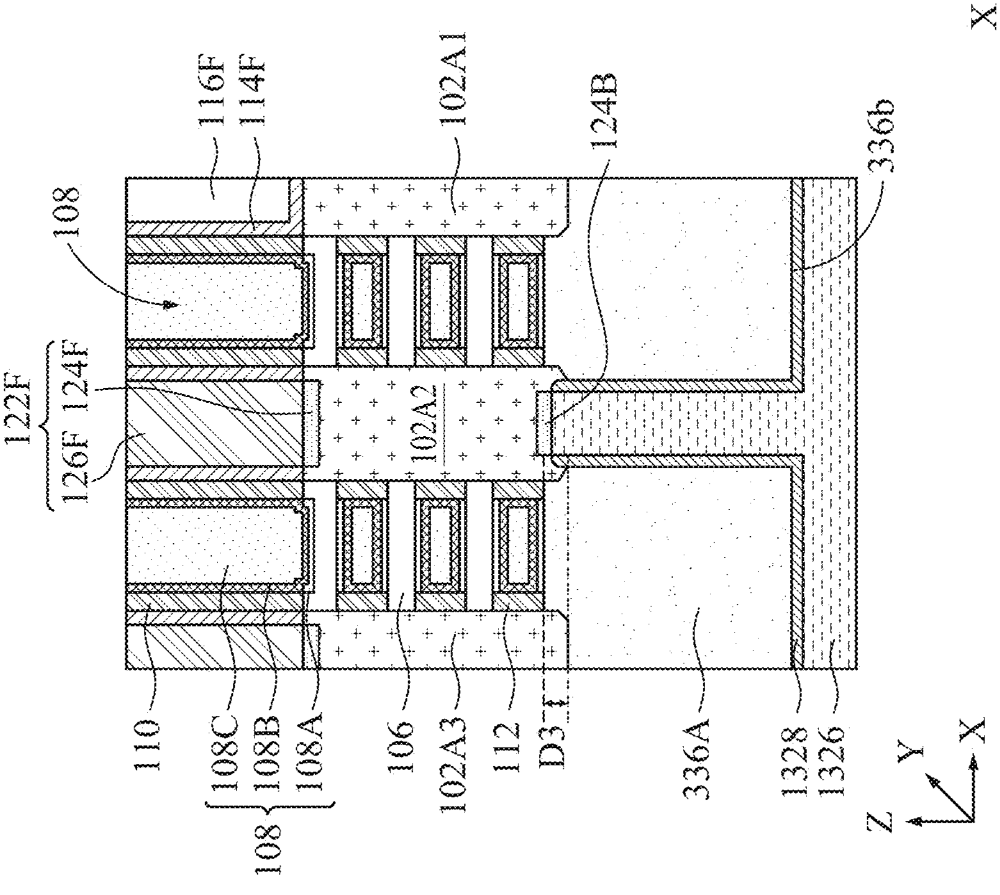
Figures 14A, 14B:
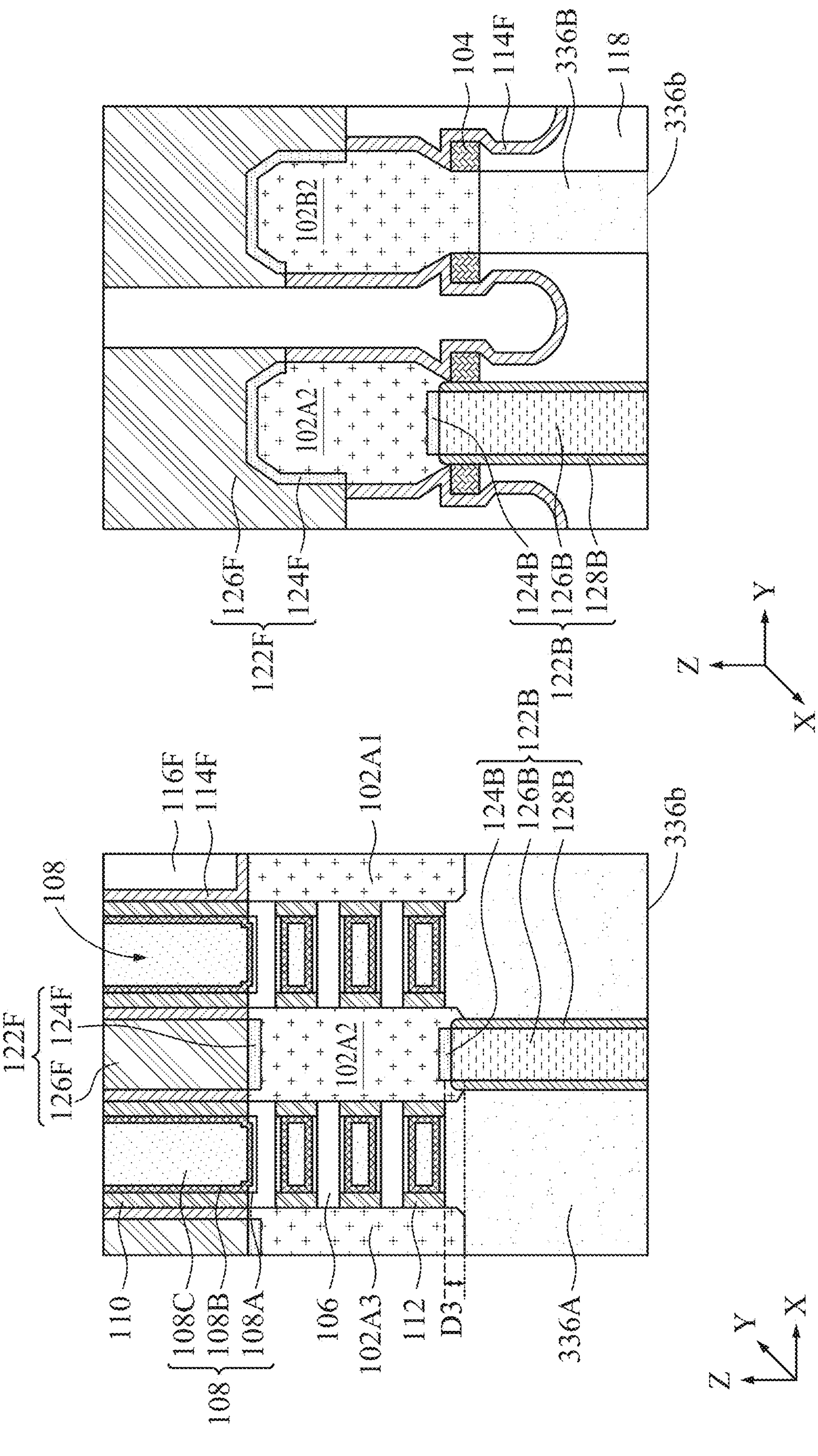

Referring to FIG. 2, in operation 240, a BS contact structure is formed on one of the S/D regions. For example, as described with reference to FIGS. 12A-14A and 12B-14B, BS contact structure 122B is formed on S/D regions 102A2. The formation of BS contact structure 122B can include sequential operations of (i) forming a contact opening 1222 on BS surface 102*b* of S/D region 102A2, (ii) forming silicide layer 124B on the exposed BS surface 102*b* in contact opening 1222, as shown in FIGS. 13A and 13B, (iii) depositing a layer 1328 having the material of diffusion barrier layer 128B, as shown in FIGS. 13A and 13B, (iv) depositing a layer 1326 having the material of contact plug 126B, as shown in FIGS. 13A and 13B, and (v) performing a CMP process on layers 1326 and 1328 to form the structures of FIGS. 14A and 14B.

In some embodiments, contact opening 1222 can be formed by using a photolithographic patterning process and an etching process to remove portions of fin structure 336A under S/D region 102A2. In some embodiments, the etching process can include a dry etching process using etchants including chlorine ($Cl_2$), hydrogen bromide (HBr), and oxygen ($O_2$). A flow rate of the etchants can range from about 5 sccm to about 200 sccm. The dry etching process can be performed at a pressure ranging from about 1 mTorr to about 100 mTorr with a plasma power ranging from about 50 W to about 250 W. In some embodiments, contact opening 1222 can extend a distance D3 of about 3 nm to about 20 nm into S/D region 102A2, as shown in FIG. 12A.

Figures 15A, 15B:
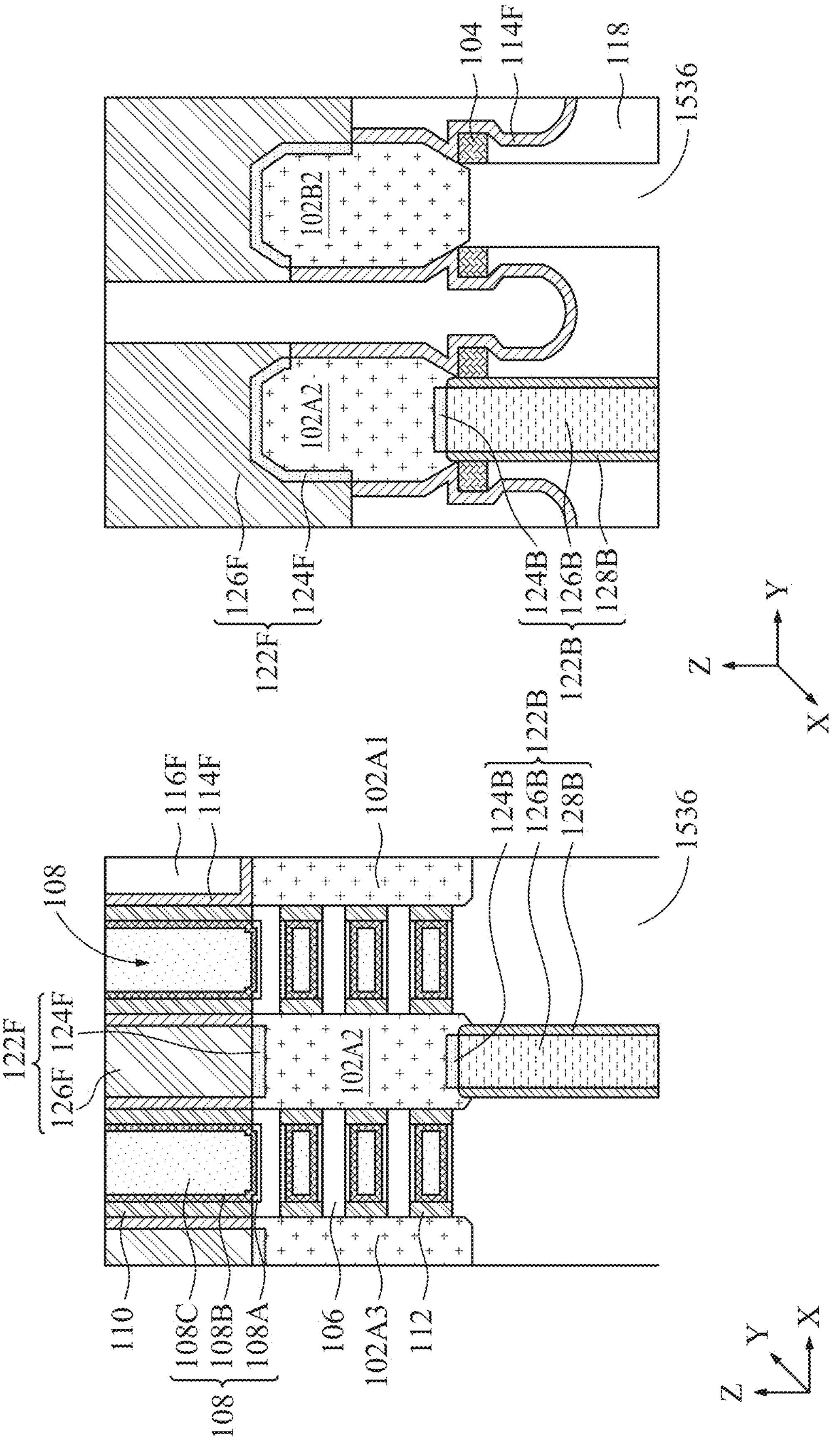
Figure 16A:
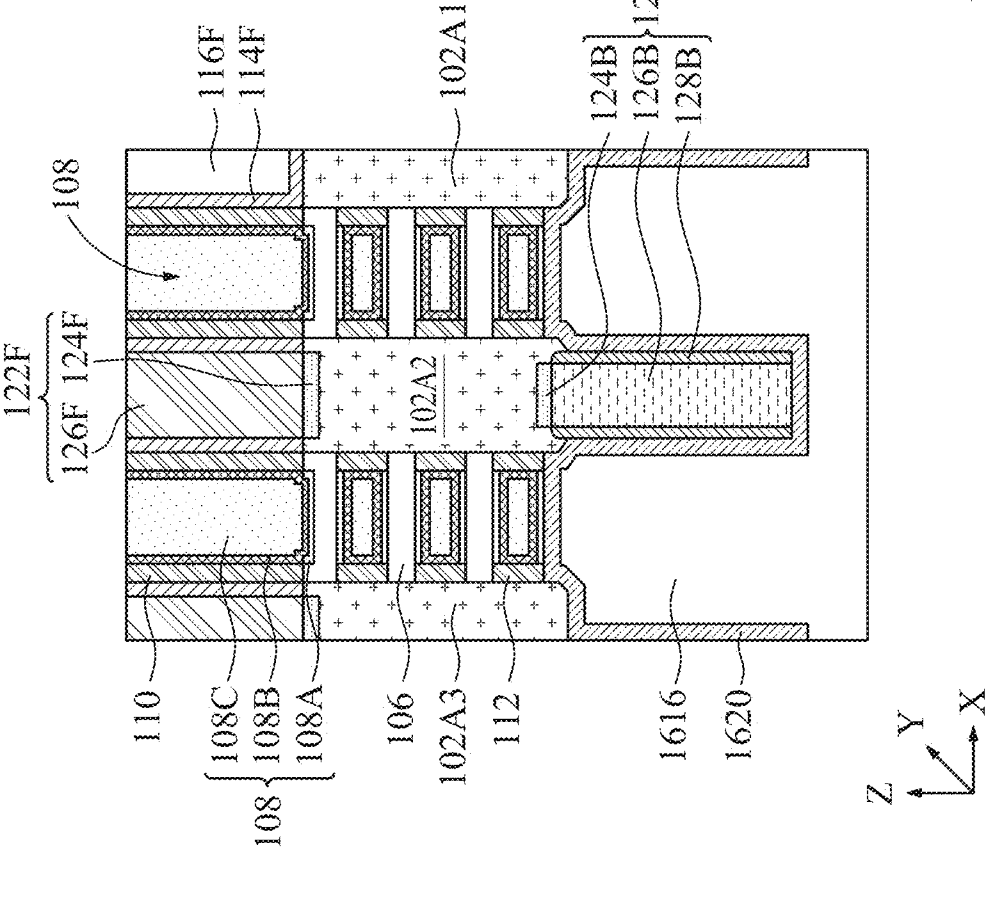
Figure 16B:
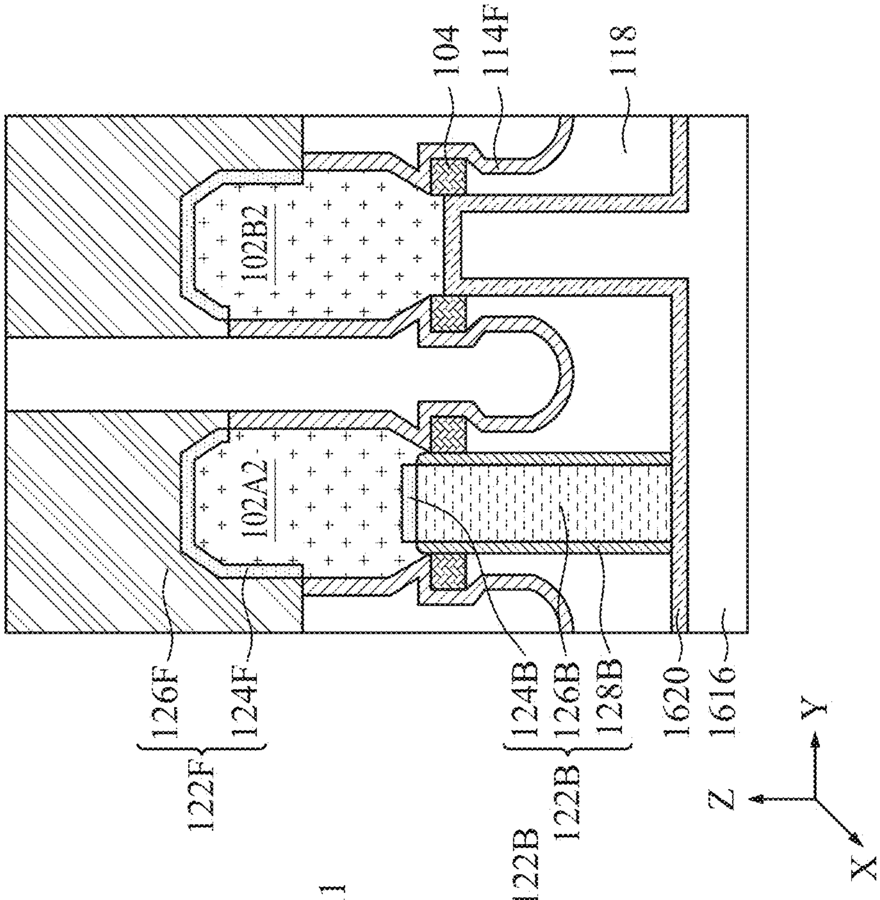
Figure 17B:
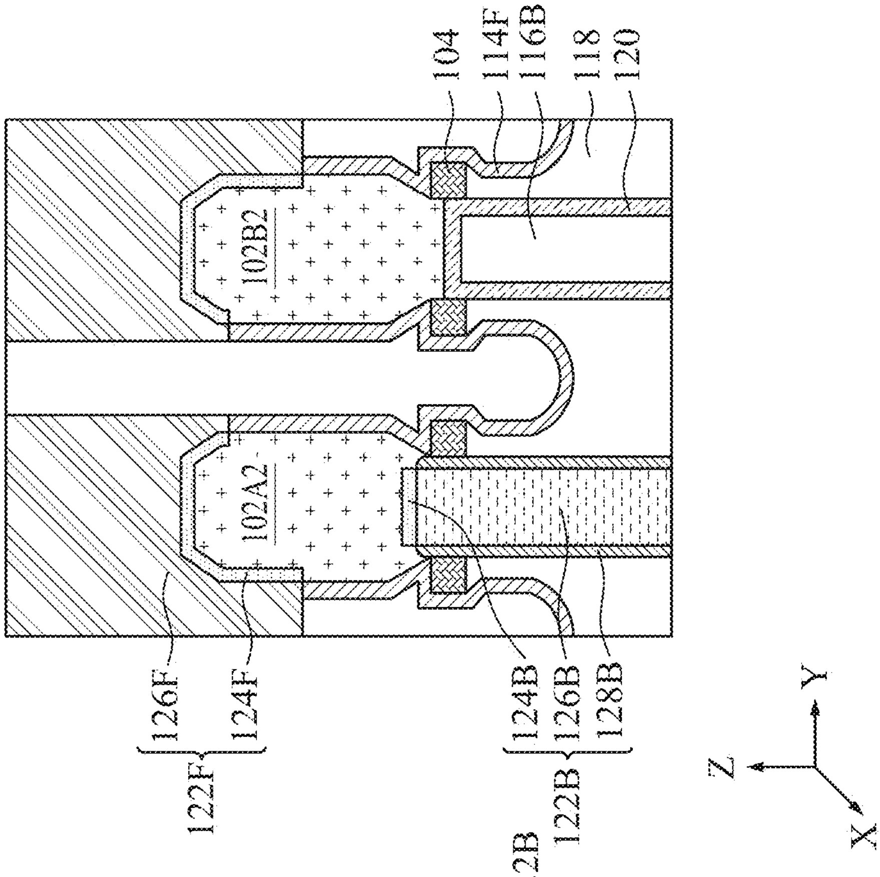
Figure 17A:
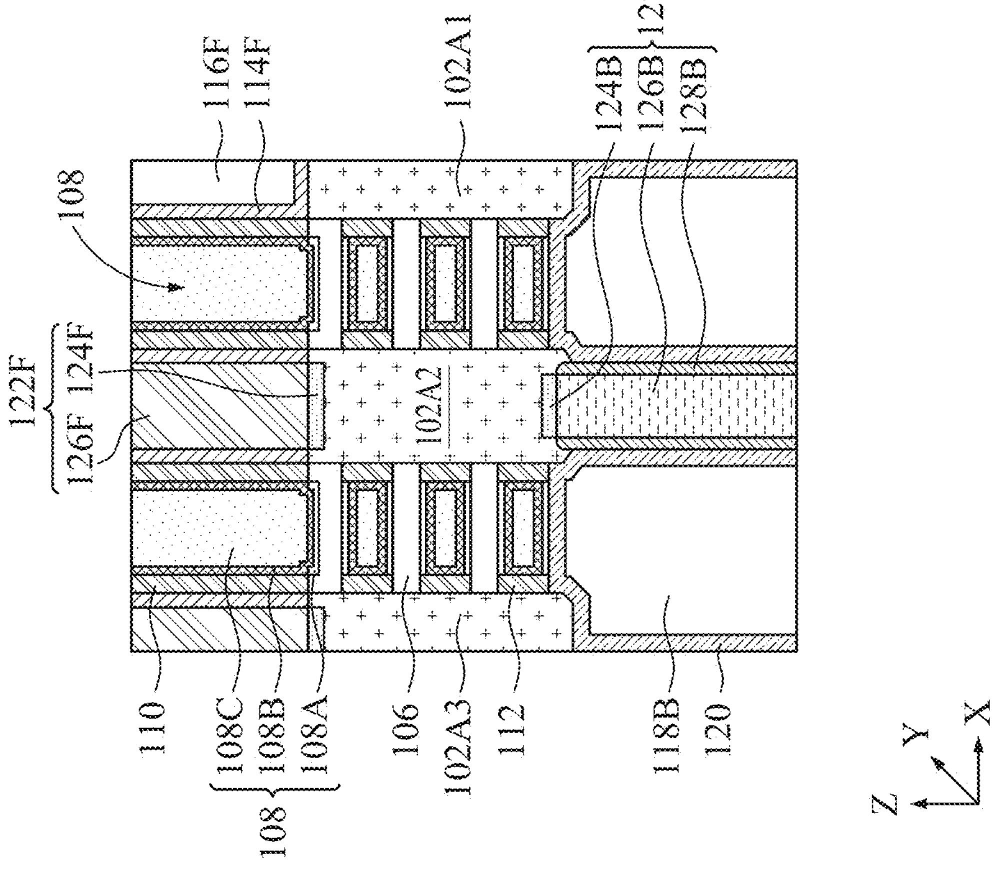

Referring to FIG. 2, in operation 245, the fin structures are replaced with a dielectric layer. For example, as described with reference to FIGS. 15A-17A and 15B-17B, fin structures 336A and 336B are replaced with BS barrier layers 120 and BS ILD layers 116B. The replacement of fin structures 336A and 336B with BS barrier layers 120 and BS ILD layers 116B can include sequential operations of (i) etching fin structures 336A and 336B to form openings 1536, as shown in FIGS. 15A and 15B, (ii) depositing a layer 1620 having the material of BS barrier layers 120, as shown in FIGS. 16A and 16B, (iii) depositing a layer 1616 having the material of BS ILD layers 116B, as shown in FIGS. 16A and 16B, and (iv) performing a CMP process on layers 1620 and 1616 to form the structures of FIGS. 17A and 17B.

Figure 18B:
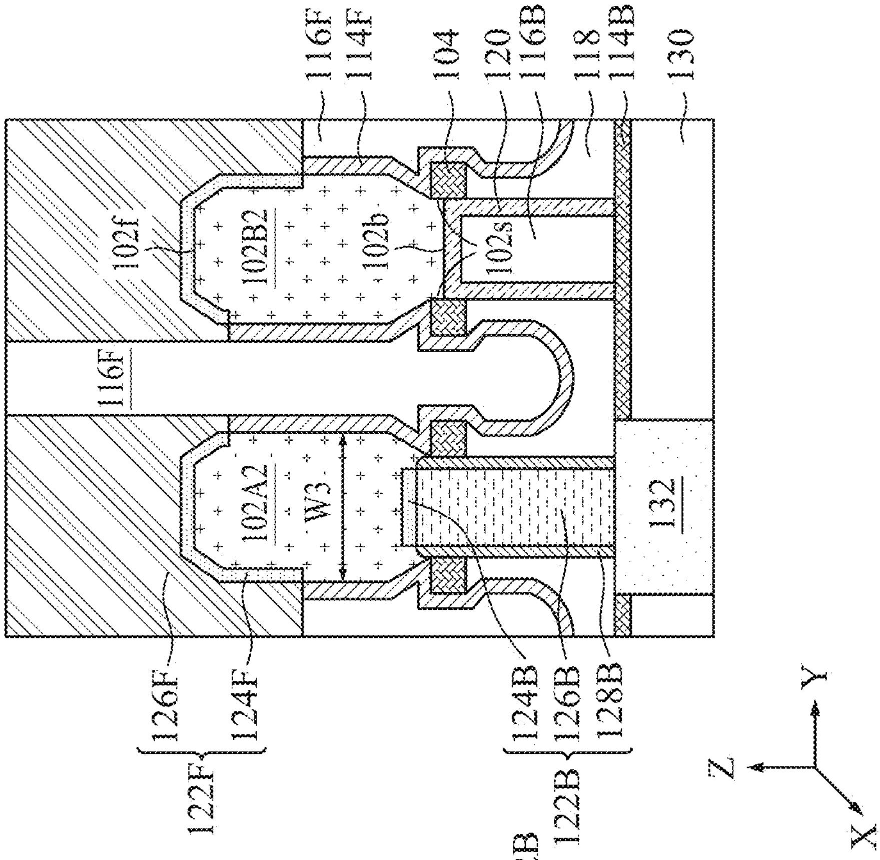
Figure 18A:
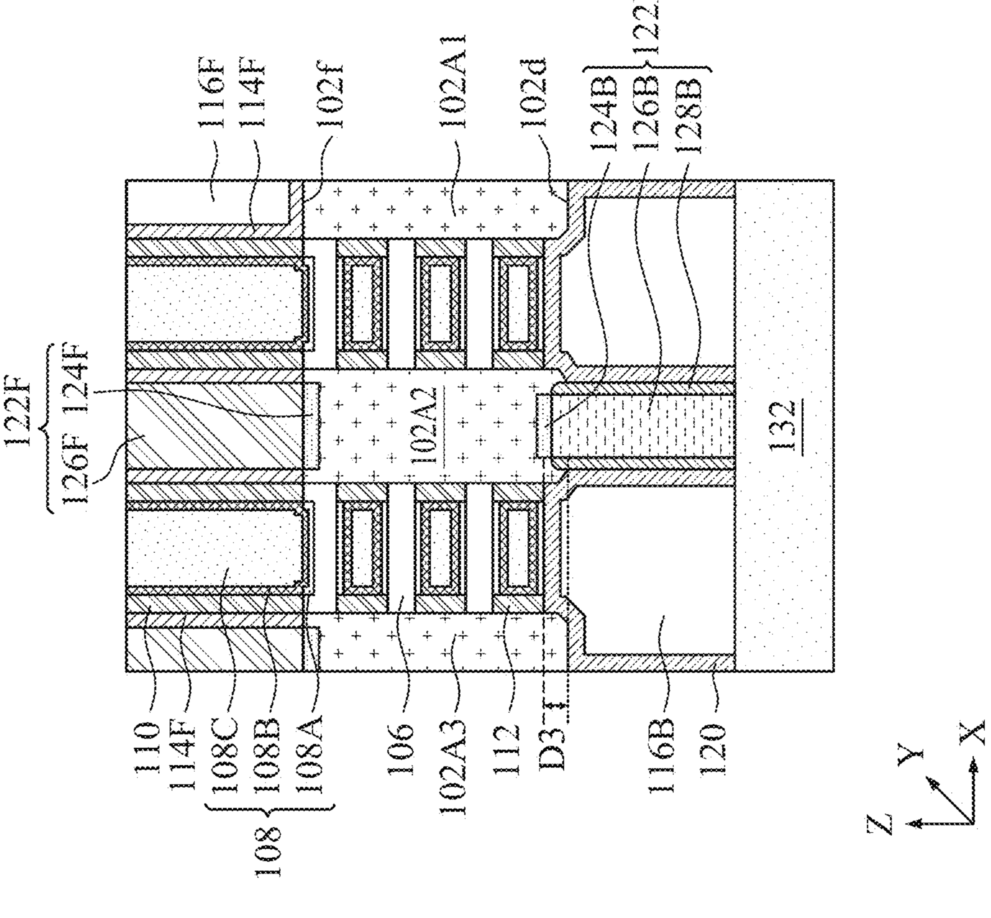

Referring to FIG. 2, in operation 250, a BS power rail is formed on the BS contact structure. For example, as shown in FIGS. 18A and 18B, BS power rail 132 is formed on BS contact structure 122B. In some embodiments, BS power rail 132 can be formed in dielectric layer 130.

The present disclosure provides example FETs (e.g., GAA FET 100) having epitaxial S/D regions (e.g., S/D regions 102) with reduced lateral dimensions and contact structures (e.g., BS contact structure 122F) electrically connecting S/D regions with BS power rails (e.g., BS power rail 132). The present disclosure also provides example methods of the semiconductor devices. In some embodiments, the FET can have S/D spacers (e.g., S/D spacers 104) formed along sidewalls of fin structures (e.g., fin structures 336A and 336B) prior to epitaxially growing the S/D regions on the fin structures. The S/D spacers can include a dielectric material and can control the epitaxial lateral growth of the S/D regions. In some embodiments, the S/D spacers can limit the epitaxial lateral growth of each side of the S/D regions to a lateral dimension (e.g., lateral distances D1 and D2) of about 1 nm to about 15 nm. To limit the epitaxial lateral growth to such lateral dimensions, the S/D spacers can have a width (e.g., width W1) of about 3 nm to about 15 nm and a thickness (e.g., thickness T1) of about 1 nm to about 30 nm. Thus, the S/D spacers can prevent the S/D regions on adjacent fin structures from merging during their epitaxial growth process. In addition, the use of S/D spacers reduces the number of processing steps and cost for forming the electrically isolated S/D regions on adjacent fin structures compared to other methods of forming electrically isolated S/D on adjacent fin structures without the S/D spacers.

In some embodiments, portions of the fin structures under the BS of one or more of the S/D regions can be replaced with back-side contact structures (e.g., BS contact structure 122F) and the other portions of the fin structures under the other S/D regions and gate structures of the semiconductor device can be replaced with a first BS dielectric layer (e.g., BS ILD layers 116B). The BS contact structures can be electrically connected to a BS power rail (e.g., BS power rail 132) formed in a second BS dielectric layer (e.g., dielectric layer 130) disposed on the first BS dielectric layer. In some embodiments, the formation of the BS power rail and the electrical connections of one or more of the S/D regions to the BS power rail can reduce device area and the number and dimension of interconnects between S/D regions and power rails, thus reducing device power consumption compared to other semiconductor devices without BS power rails. In addition, the BS power rail can be formed with a lower resistance than a FS power rail formed on the FS of the S/D regions, as the BS power rail can be formed in a larger area than the FS power rail.

Furthermore, the BS contact structures can be formed with smaller widths (e.g., about 5 nm to about 10 nm smaller than widths of the S/D regions) than FS contact structures, which require deeper etching of the S/D regions than the BS contact structures. Thus, electrically connecting the S/D regions to the BS power rail through the BS contact structures can reduce the loss of S/D regions during BS contact structure formation, thus improving device performance compared to that of devices with S/D regions electrically connected to FS power rails through FS contact structures.

In some embodiments, a semiconductor device includes first and second S/D regions, a stack of nanostructured semiconductor layers disposed adjacent to the first S/D region, a gate structure surrounding each of the nanostructured semiconductor layers, a first pair of spacers disposed on opposite sidewalls of the first S/D region, a second pair of spacers (104) disposed on opposite sidewalls of the second S/D region, a third pair of spacers disposed on opposite sidewalls of the gate structure, a first contact structure disposed on a first surface of the first S/D region, and a second contact structure disposed on a second surface of the first S/D region. The first and second surfaces are opposite to each other. The first pair of spacers are disposed on opposite sidewalls of the second contact structure.

In some embodiments, a semiconductor device includes first and second nanostructured channel regions, first and second gate structures surrounding the first and second nanostructured channel regions, respectively, an epitaxial region disposed between the first and second nanostructured channel regions, a pair of spacers disposed on opposite sidewalls of the epitaxial region, and a contact structure disposed on the epitaxial region and between the pair of spacers.

In some embodiments, a method includes forming a fin structure on a substrate, forming a superlattice structure having first and second nanostructured layers on a first fin region of the fin structure, forming first and second spacers on opposite sidewalls of the fin structure, forming an epitaxial region on a second fin region of the fin structure and between the first and second spacers, replacing a first portion of the fin structure with a conductive layer, and replacing a second portion of the fin structure with a dielectric layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

first and second source/drain (S/D) regions;

a stack of nanostructured semiconductor layers disposed adjacent to the first S/D region;

a gate structure surrounding top and bottom surfaces of each of the nanostructured semiconductor layers, wherein the top and bottom surfaces are along a horizontal surface plane;

a first pair of spacers disposed below opposite sidewalls of the first S/D region, wherein an epitaxial portion of the first S/D region overlaps one of the first pair of spacers along a vertical surface plane that is perpendicular to the horizontal surface plane;

a second pair of spacers disposed on opposite sidewalls of the second S/D region;

a third pair of spacers disposed on opposite sidewalls of the gate structure;

a first contact structure disposed on a first surface of the first S/D region; and a second contact structure disposed on a second surface of the first S/D region, wherein the first and second surfaces are opposite to each other, and wherein the first pair of spacers are disposed on opposite sidewalls of the second contact structure.

2. The semiconductor device of claim 1, further comprising a dielectric layer disposed on the second S/D region, wherein the second pair of spacers are disposed on opposite sidewalls of the dielectric layer.

3. The semiconductor device of claim 1, wherein the first and second pairs of spacers are in physical contact with the third pair of spacers, and wherein the first and second pairs of spacers are separated from each by a dielectric layer.

4. The semiconductor device of claim 1, further comprising a dielectric layer disposed on the opposite sidewalls of the first S/D region and on sidewalls of the first pair of spacers.

5. The semiconductor device of claim 1, further comprising a dielectric layer disposed between the first and second S/D regions, wherein the first and second pairs of spacers are disposed on the dielectric layer.

6. The semiconductor device of claim 1, wherein the second contact structure comprises a contact plug and a barrier layer disposed on the contact plug, and wherein the barrier layer is in contact with the first pair of spacers.

7. The semiconductor device of claim 1, further comprising:

a shallow trench isolation (STI) region disposed between the first and second S/D regions;

an interlayer dielectric (ILD) layer disposed on the STI region, wherein the ILD layer extends below bottom surfaces of the first and second pairs of spacers; and a semi-circular-shaped dielectric layer disposed between the STI region.

8. The semiconductor device of claim 1, further comprising a shallow trench isolation (STI) region disposed between the first and second S/D regions, wherein the second contact structure is disposed in the STI region.

9. The semiconductor device of claim 1, further comprising:

a first dielectric layer disposed under the second pair of spacers;

a second dielectric layer disposed under the second S/D region; and a nitride layer disposed between the first and second dielectric layers.

10. The semiconductor device of claim 1, wherein a width of the epitaxial portion is less than a width of the one of the first pair of spacers.

11. A semiconductor device, comprising:

first and second nanostructured channel regions;

first and second gate structures surrounding top and bottom surfaces of the first and second nanostructured channel regions, respectively, wherein the top and bottom surfaces are along a horizontal surface plane;

an epitaxial region disposed between the first and second nanostructured channel regions;

first and second spacers disposed below opposite sidewalls of the epitaxial region, wherein a portion of the epitaxial region overlaps the first spacer along a vertical surface plane that is perpendicular to the horizontal surface plane; and a contact structure disposed on the epitaxial region and between the first and second spacers.

12. The semiconductor device of claim 11, further comprising a dielectric layer disposed on sidewalls of the epitaxial region and on sidewalls of the first and second spacers.

13. The semiconductor device of claim 11, further comprising a shallow trench isolation (STI) region disposed under the first and second spacers and on opposite sidewalls of the contact structure.

14. The semiconductor device of claim 11, wherein a width of the portion of the epitaxial region is less than a width of the first spacer.

15. The semiconductor device of claim 11, further comprising:

a first dielectric layer disposed on a first sidewall of the contact structure;

a second dielectric layer disposed on a second sidewall of the contact structure; and a nitride layer disposed between the first and second dielectric layers.

16. The semiconductor device of claim 11, further comprising a nitride layer disposed on a sidewall of the contact structure and on a bottom surface of the first gate structure.

17. A semiconductor device, comprising:

a gate structure;

first and second source/drain regions disposed on either side of the gate structure;

a conductive structure disposed on a back-side surface of the first source/drain region;

a dielectric structure disposed on a back-side surface of the second source/drain region;

a first spacer disposed on a sidewall of the conductive structure;

a second spacer disposed on a sidewall of the dielectric structure; and a shallow trench isolation (STI) region disposed under the first and second spacers and between the conductive structure and the dielectric structure.

18. The semiconductor device of claim 17, further comprising a dielectric layer disposed between the first and second spacers.

19. The semiconductor device of claim 17, further comprising an etch stop layer disposed along sidewalls of the first and second source/drain regions facing each other and along sidewalls of the first and second spacers facing each other.

20. The semiconductor device of claim 17, further comprising a dielectric layer disposed on a back-side surface of the gate structure.

* * * * *